United States Patent
Chung et al.

(10) Patent No.: US 8,996,947 B2
(45) Date of Patent: Mar. 31, 2015

(54) GENERATION OF PROGRAM DATA FOR NONVOLATILE MEMORY

(75) Inventors: Jungsoo Chung, Seoul (KR); Junjin Kong, Yongin-si (KR); Changkyu Seol, Osan-si (KR); Hong Rak Son, Anyang-si (KR); Pilsang Yoon, Hwaseong-si (KR); Seonghyeog Choi, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/598,978

(22) Filed: Aug. 30, 2012

(65) Prior Publication Data
US 2013/0173983 A1     Jul. 4, 2013

(30) Foreign Application Priority Data
Jan. 4, 2012    (KR) ........................ 10-2012-0000997

(51) Int. Cl.
*H03M 13/00*     (2006.01)
*G06F 11/10*     (2006.01)
*G11C 11/56*     (2006.01)

(52) U.S. Cl.
CPC ........ *G06F 11/1048* (2013.01); *G11C 11/5628* (2013.01)
USPC ...................................................... 714/752

(58) Field of Classification Search
USPC ........................................................ 714/752
See application file for complete search history.

(56) References Cited

U.S. PATENT DOCUMENTS

| 5,566,099 | A | | 10/1996 | Shimada | |
|---|---|---|---|---|---|
| 5,636,225 | A | * | 6/1997 | Osawa | 714/718 |
| 6,167,553 | A | * | 12/2000 | Dent | 714/819 |
| 7,804,726 | B2 | | 9/2010 | Cho et al. | |
| 7,865,802 | B1 | * | 1/2011 | Feng et al. | 714/758 |
| 8,261,159 | B1 | * | 9/2012 | Sommer et al. | 714/768 |
| 2002/0037080 | A1 | * | 3/2002 | Katayama et al. | 380/267 |
| 2004/0201504 | A1 | * | 10/2004 | Yamamoto et al. | 341/50 |
| 2004/0205352 | A1 | * | 10/2004 | Ohyama | 713/194 |
| 2004/0225842 | A1 | * | 11/2004 | Rowlands et al. | 711/133 |
| 2006/0170573 | A1 | * | 8/2006 | Ma et al. | 341/51 |
| 2006/0220928 | A1 | * | 10/2006 | Ito et al. | 341/50 |
| 2006/0259263 | A1 | * | 11/2006 | Ashley et al. | 702/107 |
| 2007/0067375 | A1 | * | 3/2007 | Inaoka et al. | 708/250 |
| 2007/0067692 | A1 | * | 3/2007 | Dichtl | 714/738 |
| 2008/0158948 | A1 | * | 7/2008 | Sharon et al. | 365/185.02 |
| 2008/0215893 | A1 | * | 9/2008 | Bliss et al. | 713/189 |

(Continued)

FOREIGN PATENT DOCUMENTS

JP     2010-181789     8/2010
KR     1020110067656 A     6/2011

OTHER PUBLICATIONS

Title: Data Scrambling in Memories: A Security Measure; Author: Mădălin-loan Neagu, Liviu Miclea; Publisher IEEE 978-1-4799-373, Date 2014.*

(Continued)

*Primary Examiner* — April Y Blair
*Assistant Examiner* — Thien D Nguyen
(74) *Attorney, Agent, or Firm* — Volentine & Whitt, PLLC

(57) ABSTRACT

A method generating program data to be stored in a nonvolatile memory device comprises randomizing the program data, and processing the randomized program data to reduce a frequency of at least one data state among the randomized program data.

13 Claims, 20 Drawing Sheets

(56) References Cited

U.S. PATENT DOCUMENTS

| | | | |
|---|---|---|---|
| 2008/0240278 A1* | 10/2008 | Bliss et al. | 375/265 |
| 2008/0273384 A1* | 11/2008 | Sarin et al. | 365/185.03 |
| 2008/0294840 A1* | 11/2008 | Bliss et al. | 711/105 |
| 2009/0027239 A1* | 1/2009 | Coene | 341/50 |
| 2009/0217094 A1* | 8/2009 | Matsumoto et al. | 714/32 |
| 2009/0323942 A1* | 12/2009 | Sharon et al. | 380/44 |
| 2010/0088574 A1* | 4/2010 | Kim et al. | 714/763 |
| 2010/0257429 A1 | 10/2010 | Noguchi | |
| 2010/0293393 A1* | 11/2010 | Park | 713/193 |
| 2011/0032759 A1 | 2/2011 | Kim et al. | |
| 2011/0035645 A1* | 2/2011 | Yang | 714/763 |
| 2011/0142232 A1* | 6/2011 | Jeong et al. | 380/42 |
| 2011/0176679 A1* | 7/2011 | Mozak | 380/268 |
| 2011/0274193 A1* | 11/2011 | Yoon et al. | 375/260 |

OTHER PUBLICATIONS

Title: A Low-Complexity Peak-to-Average Power Ratio Reduction Technique for OFDM Systems Using Guided Scrambling Coding; Author: Chin-Liang Wang, Yuan Ouyang, and Feng-Hsing Huang; Publisher IEEE 1550-2252, Date 2007.*

* cited by examiner

US 8,996,947 B2

GENERATION OF PROGRAM DATA FOR NONVOLATILE MEMORY

CROSS-REFERENCE TO RELATED APPLICATIONS

This application claims priority under 35 U.S.C. §119 to Korean Patent Application No. 10-2012-0000997 filed Jan. 4, 2012, the subject matter of which is hereby incorporated by reference.

BACKGROUND OF THE INVENTION

The inventive concept relates generally to electronic data storage technologies. More particularly, the inventive concept relates to methods and apparatuses for generating program data for nonvolatile memory devices.

Flash memory is a type of electrically erasable programmable read only memory (EEPROM) that has gained increasing popularity in recent years due to attractive features such as relatively low cost, efficient performance, low power consumption, and nonvolatile data storage. In an effort to further improve flash memory, researchers have continually sought ways to increase its data storage capacity, reliability, durability, and various other parameters.

One way to increase the storage capacity of flash memory is by storing more than one bit of data per memory cell. A flash memory capable of storing more than one bit of data is referred to as a multi-level-cell (MLC) flash memory. Unfortunately, increasing the number of bits stored in each memory cell tends to reduce the reliability of stored data. One reason for this decrease in reliability is that increasing the number of bits tends to decrease the margins between threshold voltage distributions representing the stored data. This reduction in margins may lead to overlapping distributions, making it difficult or impossible to distinguish between different data states. Moreover, the problem of reduced margins is exacerbated by electrical effects that can widen the threshold voltage distributions of programmed memory cells, such as coupling between adjacent memory cells.

In view of these and other shortcomings, there is a general need for techniques and technologies to improve the reliability of flash memory devices, especially those designed to store more than one bit of data per memory cell.

SUMMARY OF THE INVENTION

In one embodiment of the inventive concept, a method is provided for generating program data to be stored in a nonvolatile memory device. The method comprises randomizing the program data, and processing the randomized program data to reduce a frequency of at least one data state among the randomized program data.

In another embodiment of the inventive concept, a memory controller is configured to control a nonvolatile memory device. The memory comprises a randomizer configured to randomize program data to be stored in the nonvolatile memory device, and a guided scramble block configured to adjust a number of first bits in the randomized program data to reduce a frequency of a data state corresponding to an uppermost program state among data states in the randomized program data.

In another embodiment of the inventive concept, a memory system comprises a controller configured to randomize program data, add a plurality of guide data values to respective data values among the randomized program data, reduce a frequency of at least one data state among the randomized program data based on the added guide data, and send the randomized program data with reduced frequency of the at least one data state; and a nonvolatile memory device configured to store the randomized program data.

These and other embodiments of the inventive concept may potentially improve the reliability of memory cells by preventing their threshold voltage distributions from being widened when adjacent memory cells are programmed subsequently.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

In the description that follows, the terms "first", "second", "third", etc., may be used to describe various features, but the described features are not to be limited by these terms. Rather, these terms are used merely to distinguish between different features. Thus, a first feature could alternatively be termed a second feature and vice versa without changing the meaning of the relevant description.

The terminology used herein is for the purpose of describing particular embodiments only and is not intended to limit the scope of the inventive concept. The singular forms "a", "an" and "the" are intended to encompass the plural forms as well, unless the context clearly indicates otherwise. Terms such as "comprises", "comprising," "includes", and/or "including", where used in this specification, indicate the presence of stated features but do not preclude the presence or addition of other features. The term "and/or" indicates any and all combinations of one or more associated listed items.

Where a feature is referred to as being "on", "connected to", "coupled to", or "adjacent to" another feature, it can be directly on, connected, coupled, or adjacent to the other feature, or intervening features may be present. In contrast, where a feature is referred to as being "directly on," "directly connected to", "directly coupled to", or "immediately adjacent to" another feature, there are no intervening features present.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and/or the this description and will not be interpreted in an idealized or overly formal sense unless expressly so defined herein.

Figure 1:
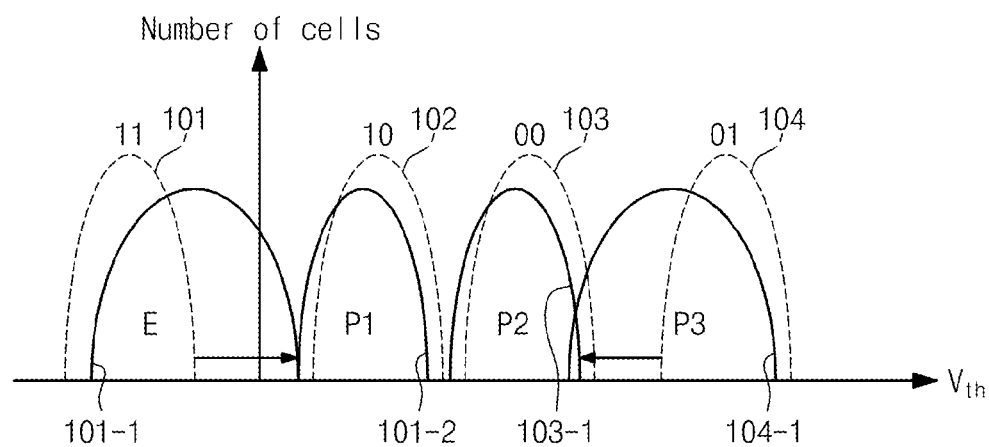
FIG. 1 is a diagram illustrating threshold voltage distributions of memory cells each storing multi-bit data.

FIG. 1 is a diagram illustrating threshold voltage distributions of memory cells each storing multi-bit data. In the example of FIG. 1, a memory cell stores 2-bit data using four threshold voltage distributions respectively corresponding to four states (or, referred to as data states). For ease of description, FIG. 1 relates to memory cells storing 2-bit data, but the inventive concept is not limited to 2-bit data. For example, the inventive concept can be applied to m-bit data, where m is an integer greater than 2. In FIG. 1, a horizontal axis indicates a threshold voltage, and a vertical axis indicates the number of memory cells.

Referring to FIG. 1, threshold voltage distributions 101, 102, 103, and 104 illustrated by dotted lines may indicate initial threshold voltage distributions, respectively. Threshold voltage distributions 101-1, 102-1, 103-1, and 104-1 illustrated by solid lines indicate threshold voltage distributions that have been degraded and may result in improper functioning of the memory cells. Threshold voltage distributions 101, 102, 103, and 104 correspond to data values such as "11", "10", "00", and "01", respectively. This bit ordering is merely one example, and other bit orderings could be used in alternative embodiments.

In a multi-level cell (MLC) memory device, a distribution of one or more states may deteriorate more than others, which can lower the reliability of the MLC memory device. Moreover, this problem may increase as fabrication processes become finer. In FIG. 1, for instance, an erase state corresponding to threshold voltage distribution 101 is widened on its right side. This deterioration may be produced by coupling between memory cells in the erase state and memory cells having program states. This problem may be addressed generally through the use of error correction. However, extensive use of error correction tends to increase cell overhead and hardware complexity of an error correcting code (ECC) circuit.

Accordingly, as described below, in certain embodiments of the inventive concept, deterioration of a threshold voltage distribution is improved by adjusting the number of memory cells having a program state affecting an erase state E and/or the number of memory cells having erase state E.

Figure 2:
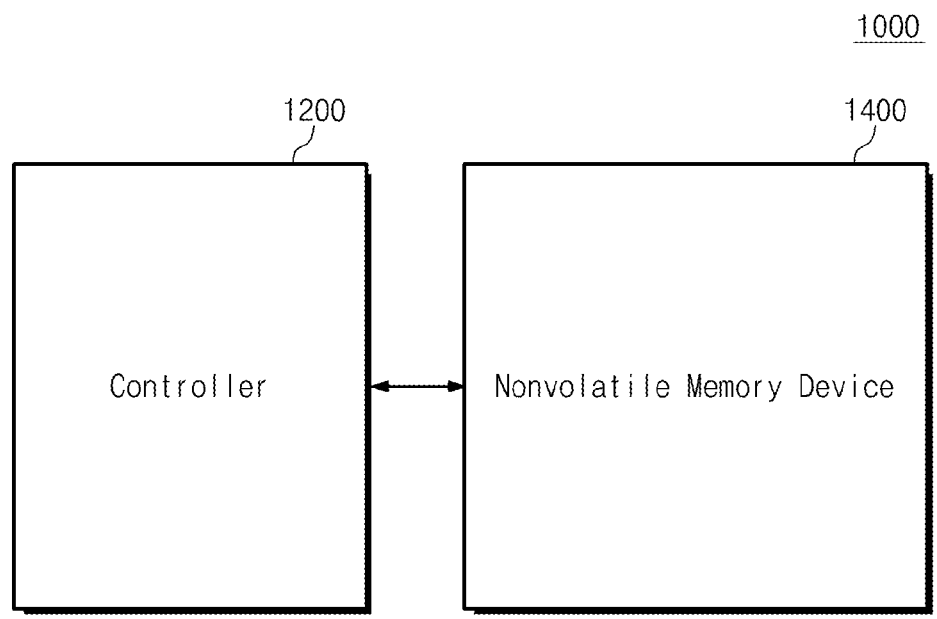
FIG. 2 is a block diagram of a memory system according to an embodiment of the inventive concept.

FIG. 2 is a block diagram of a memory system 1000 according to an embodiment of the inventive concept.

Referring to FIG. 2, memory system 1000 comprises a memory controller 1200 and a nonvolatile memory device 1400. Memory controller 1200 controls nonvolatile memory device 1400 in response to a request from an external source, such as a host. Memory controller 1200 also controls nonvolatile memory device 1400 in response to internal requests, such as operations associated with sudden power-off, background operations such as merge, garbage collection, etc. Nonvolatile memory device 1400 operates under control of memory controller 1200, and it may be used as a type of storage medium. The storage medium can be formed of one or more memory chips. Nonvolatile memory device 1400 typically communicates with memory controller 1200 via one or more channels. Nonvolatile memory device 1400 may include, for instance, a NAND flash memory device.

Memory controller 1200 processes data to be stored in nonvolatile memory device 1400 such that a frequency of specific data state(s) becomes non-uniform (or, uniform). For example, memory controller 1200 may process data to be stored in nonvolatile memory device 1400 such that a frequency of uppermost program state P3 is reduced. As described above, an erased memory cell may be affected the most by uppermost program state P3. As the frequency of program state P3 is reduced, coupling between an erased memory cell and a memory cell having program state P3 may be reduced accordingly. That is, it is possible to reduce deterioration of a threshold voltage distribution corresponding to the erase state. On the other hand, deterioration of a threshold voltage distribution corresponding to the erase state may be reduced by decreasing the frequency of the erase state. Further, deterioration of a threshold voltage distribution corresponding to the erase state can be reduced by concurrently decreasing the frequency of the erase state and the frequency of uppermost program state P3.

Figure 3:
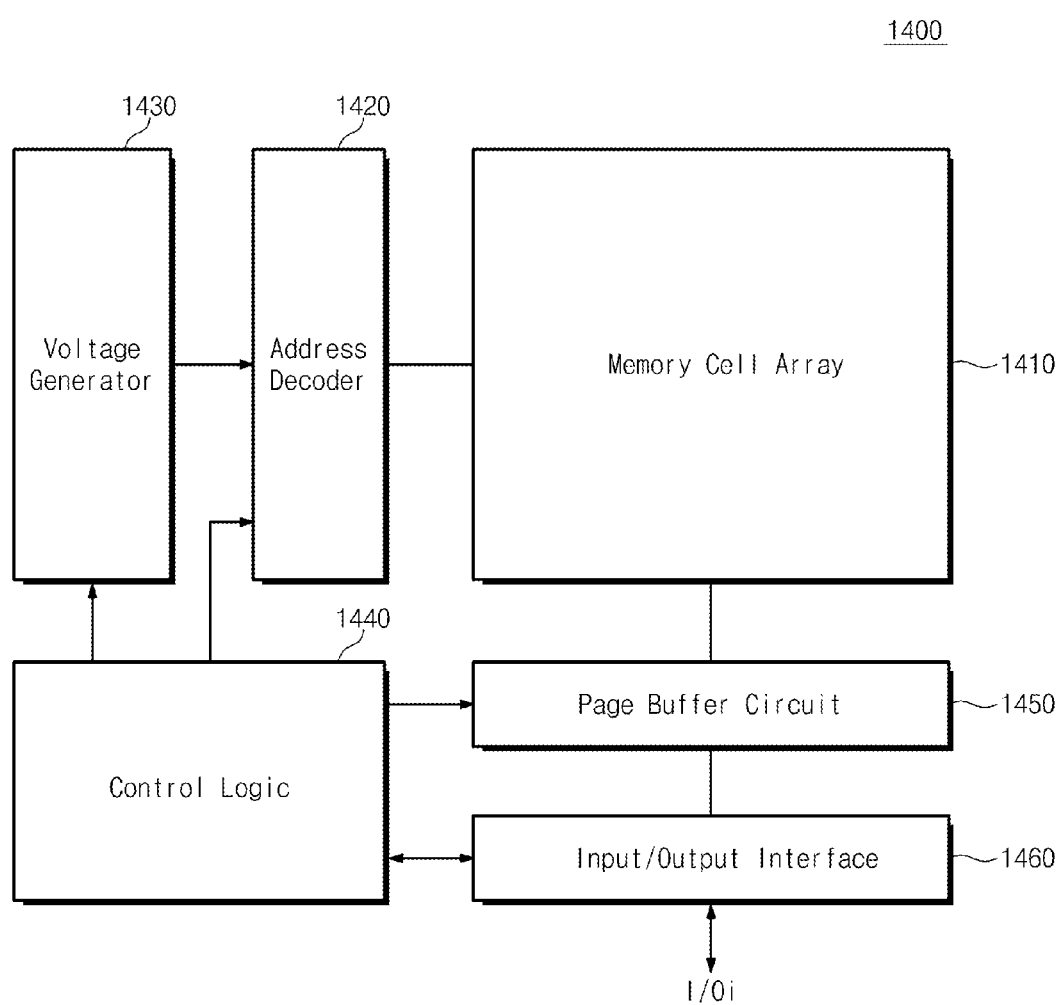
FIG. 3 is a block diagram of a nonvolatile memory device shown in FIG. 2.

FIG. 3 is a block diagram illustrating an example of nonvolatile memory device 1400 of FIG. 2. In the example of FIG. 3, it is assumed that nonvolatile memory device 1400 is a NAND flash memory device. However, nonvolatile memory device 1400 is not limited to a NAND flash memory device, and it may take alternative forms, such as a NOR flash memory device, a resistive random access memory (RRAM) device, a phase-change memory (PRAM) device, a magnetoresistive random access memory (MRAM) device, a ferroelectric random access memory (FRAM) device, or a spin transfer torque random access memory (STT-RAM), for example. Further, nonvolatile memory device 1400 can be implemented with a three-dimensional array structure. Such a nonvolatile memory device may be, for example, a vertical NAND flash memory device. Additionally, the inventive concept may be embodied in a charge trap flash (CTF) memory device comprising a charge storage layer formed of an insulation film as well as a flash memory device comprising a charge storage layer formed of a conductive floating gate.

Referring to FIG. 3, nonvolatile memory device 1400 comprises a memory cell array 1410, an address decoder 1420, a voltage generator 1430, control logic 1440, a page buffer circuit 1450, and an input/output interface 1460.

Memory cell array 1410 comprises memory cells arranged at intersections of rows (e.g., word lines) and columns (e.g., bit lines). Each memory cell may store 1-bit data or M-bit data (M>1). Address decoder 1420 is controlled by control logic 1440, and it performs selecting and driving operations on rows (e.g., word lines, a string selection line(s), a ground selection line(s), a common source line, etc.) of memory cell array 1410. Voltage generator 1430 is controlled by control logic 1440, and it generates voltages required for operations such as a high voltage, a program voltage, a read voltage, a verification voltage, an erase voltage, a pass voltage, a bulk voltage, and the like. Voltages generated by voltage generator 1430 are provided to memory cell array 1410 via address decoder 1420. Control logic 1440 is configured to control overall operations of nonvolatile memory device 1400.

Page buffer circuit 1450 is controlled by control logic 1440, and is configured to read data from memory cell array 1410 and to drive columns (e.g., bit lines) of memory cell array 1410 according to program data. Page buffer circuit 1450 comprises page buffers respectively corresponding to bit lines or bit line pairs. Each of the page buffers comprises a plurality of latches. Input/output interface 1460 is controlled by control logic 1440, and it interfaces with an external device, such as a memory controller. Although not illustrated in FIG. 3, input/output interface 1460 may comprise a column decoder configured to select page buffers of page buffer circuit 1450 by a predetermined unit, an input buffer receiving data, an output buffer outputting data, and the like.

Figure 4:
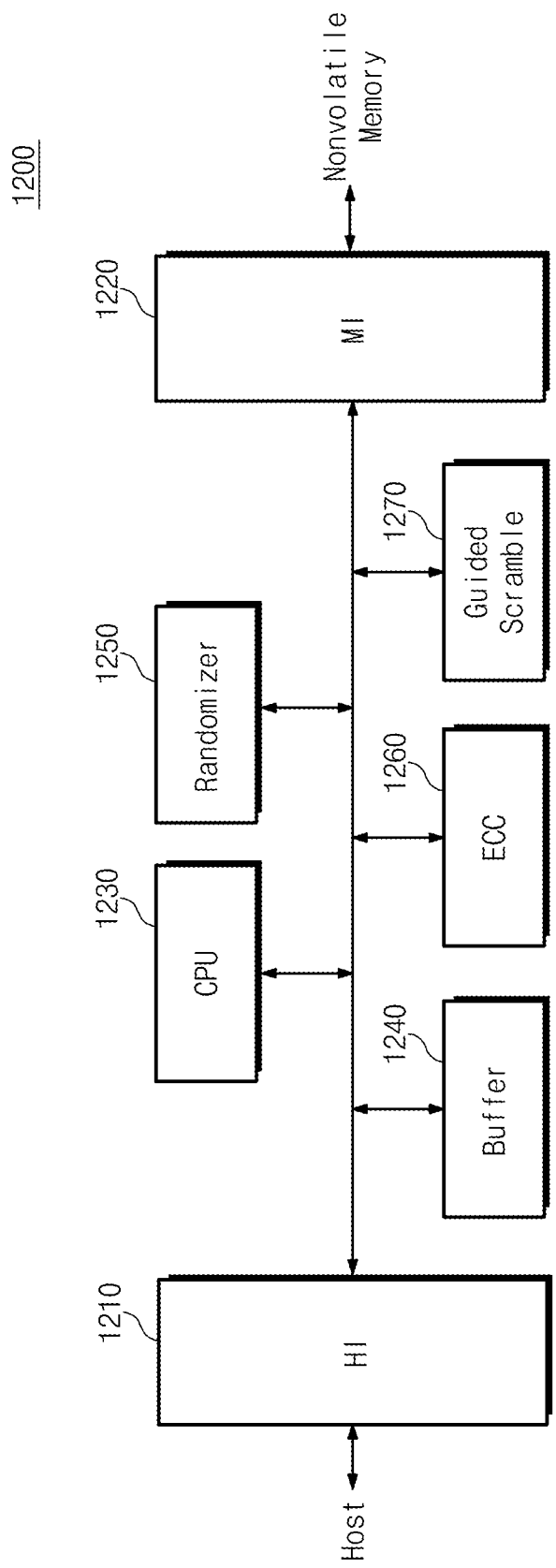
FIG. 4 is a block diagram a memory controller shown in FIG. 2.

FIG. 4 is a block diagram illustrating an example of memory controller 1200 of FIG. 2.

Referring to FIG. 4, controller 1200 comprises a host interface 1210 as a first interface, a memory interface 1220 as a second interface, a CPU 1230, a buffer memory 1240, a randomizer 1250, an error detecting and correcting circuit (ECC) 1260, and a guided scramble block 1270.

Host interface 1210 is configured to interface with an external device (or, a host), and memory interface 1220 is configured to interface with nonvolatile memory device 1400. CPU 1230 is configured to control overall operations of controller 1200, e.g., through the use of firmware such as Flash Translation Layer (FTL). Buffer memory 1240 temporarily stores data transferred from an external device via host interface 1210 or data transferred from nonvolatile memory device 1400 via memory interface 1220. Buffer memory 1240 stores information (referred to as mapping or metadata information) needed to control nonvolatile memory device 1400.

Randomizer 1250 is configured to randomize data to be stored in nonvolatile memory device 1400 and to de-randomize data read from nonvolatile memory device 1400. An example of the randomizer is disclosed in U.S. Patent Publication No. 2010/0088574, the subject matter of which is hereby incorporated by reference. In general, the frequencies of data states E, P1, P2, and P3 may become uniform by randomizing data to be stored in nonvolatile memory device 1400.

ECC 1260 encodes data to be stored in nonvolatile memory device 1400 and decodes data read out from nonvolatile memory device 1400. Guided scramble block 1270 scrambles randomized data based on guide data. For example, guided scramble block 1270 may adjust the number of ones or zeros in the randomized data according to the guide data, as is more fully described below. The frequency of specific program state(s) (e.g., an erase state and an uppermost program state) may be reduced by adjusting the number of ones or zeros in data to be stored in nonvolatile memory device 1400. That is, the number of '1' or '0' of the randomized data may become non-uniform.

In various alternative embodiments, host interface 1210 may be formed of one of various computer bus standards, storage bus standards, or iFCPPeripheral bus standards, or a combination of two or more standards. Examples of the computer bus standards include S-100 bus, Mbus, Smbus, Q-Bus, ISA, Zorro II, Zorro III, CAMAC, FASTBUS, LPC, EISA, VME, VXI, NuBus, TURBOchannel, MCA, Sbus, VLB, PCI, PXI, HP GSC bus, CoreConnect, InfiniBand, UPA, PCI-X, AGP, PCIe, Intel QuickPath Interconnect, Hyper Transport, etc. Examples of the storage bus standards include ST-506, ESDI, SMD, Parallel ATA, DMA, SSA, HIPPI, USB MSC, FireWire(1394), Serial ATA, eSATA, SCSI, Parallel SCSI, Serial Attached SCSI, Fibre Channel, iSCSI, SAS, RapidIO, FCIP, etc. Examples of the iFCPPeripheral bus standards include Apple Desktop Bus, HIL, MIDI, Multibus, RS-232, DMX512-A, EIA/RS-422, IEEE-1284, UNI/O, 1-Wire, I2C, SPI, EIA/RS-485, USB, Camera Link, External PCIe, Light Peak, Multidrop Bus, etc.

Figure 5:
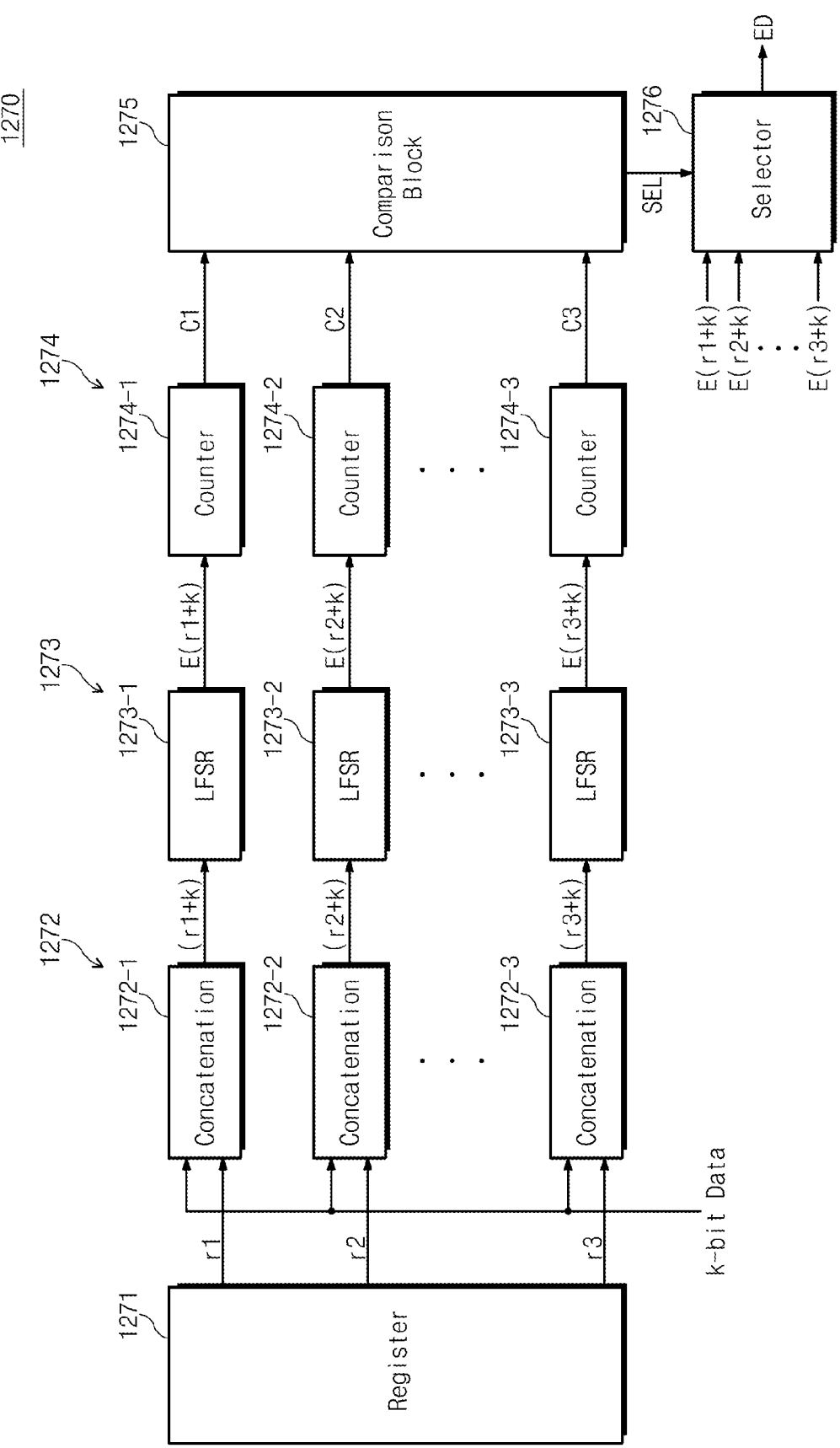
FIG. 5 is a block diagram of a guided scramble block in the memory controller of FIG. 4.
Figure 6:
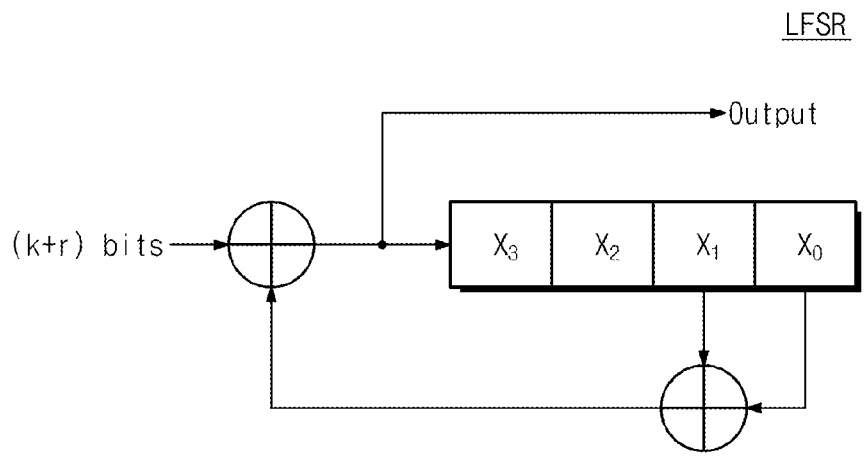
FIG. 6 is a diagram of a linear feedback shift register in the guided scramble block of FIG. 5.

FIG. 5 is a block diagram of guided scramble block 1270 of FIG. 4. FIG. 6 is a diagram illustrating a linear feedback shift register in FIG. 5.

Referring to FIG. 5, guide scramble block 1270 encodes input data such that the number of first bits or second bits in the input data is increased or decreased. Herein, a first bit may be logical '1', and a second bit may be logical '0'. Alternatively, the first bit and the second bit may represent logical '0' and logical '1', respectively.

Guide scramble block 1270 comprises a register 1271, an adder block 1272, an LFSR block 1273, a counter block 1274, a comparison block 1275, and a selector 1276. Register 1271 is configured to store multiple units of guide data, where each unit of guide data comprises r-bit data (r>1). Adder block 1272 is configured to add guide data into input data. For example, where r-bit guide data and k-bit input data are provided to adder block 1272, (r+k)-bit data may be output from adder block 1272. Adder block 1272 comprises a plurality of adders 1272-1 to 1282-3 each configured to add corresponding guide data into input data. Guide data values provided to adders 1272-1 to 1272-3 are different from one another. In other words, the same input data is provided to adders 1272-1 to 1272-3, while different guide data values are provided to adders 1272-1 to 1272-3.

LFST block 1273 comprises linear feedback shift registers 1274-1 to 1274-3 respectively corresponding to adders 1272-1 to 1272-3 of adder block 1272. Linear feedback shift registers 1273-1 to 1273-3 are configured to encode outputs of corresponding adders 1272-1 to 1272-3 according to a primitive polynomial. The same primitive polynomial may be applied to linear feedback shift registers 1273-1 to 1273-3. For example, each of linear feedback shift registers 1273-1 to 1273-3 may be configured to satisfy a polynomial such as ($X^4$+X+1) as illustrated in FIG. 6. However, linear feedback shift registers 1273-1 to 1273-3 are not limited to the configurations shown in FIG. 6. Although linear feedback shift registers 1273-1 to 1273-3 are formed equivalent to one another, linear feedback shift registers 1273-1 to 1273-3 may generate different data values due to different guide data values.

Counter block 1274 comprises counters 1274-1 to 1274-3 respectively corresponding to linear feedback shift registers 1273-1 to 1273-3. Counters 1274-1 to 1274-3 count the number of first bits (e.g., logical '1') or the number of second bits (e.g., logical '0') of output data values of the corresponding linear feedback shift registers 1273-1 to 1273-3. For example, counters 1274-1 to 1274-3 may count the number of first bits (e.g., logical '1') of output data values E(r1+k) to E(r3+k) of the corresponding linear feedback shift registers 1273-1 to

1273-3. Alternatively, counters 1274-1 to 1274-3 may be configured to count the number of second bits (e.g., logical '0') of output data values E(r1+k) to E(r3+k) of the corresponding linear feedback shift registers 1273-1 to 1273-3. Comparison block 1275 is configured to select one of count values C1 to C3 of counters 1274-1 to 1274-3. Comparison block 1275 outputs a selection signal SEL for selecting an output of a linear feedback shift register corresponding to the selected count value.

For example, comparison block 1275 may be configured to select the smallest count value of count values C1 to C3 of counters 1274-1 to 1274-3. This may mean that there is selected data in which the number of first bits is smallest. On the other hand, comparison block 1275 may be configured to select the largest count value among count values C1 to C3 of counters 1274-1 to 1274-3. This may mean that there is selected data in which the number of first bits is largest. selector 1275 may receive outputs E(r1+k) to E(r3+k) of linear feedback shift registers 1273-1 to 1273-3, and may select one of outputs E(r1+k) to E(r3+k) of linear feedback shift registers 1273-1 to 1273-3 as data ED to be stored in a nonvolatile memory device 1400 in response to selection signal SEL from comparison block 1275.

In some embodiments, elements 1271 to 1276 constitute an encoding unit of guided scramble block 1270.

In general, a size of data being processed by guided scramble block 1270 may be decided variously. For example, guided scramble block 1270 may be configured to process input data by a 64-bit, 128-bit, or 256-bit unit. However, it is well understood that a size of data being processed by guided scramble block 1270 is not limited thereto.

Figure 7:
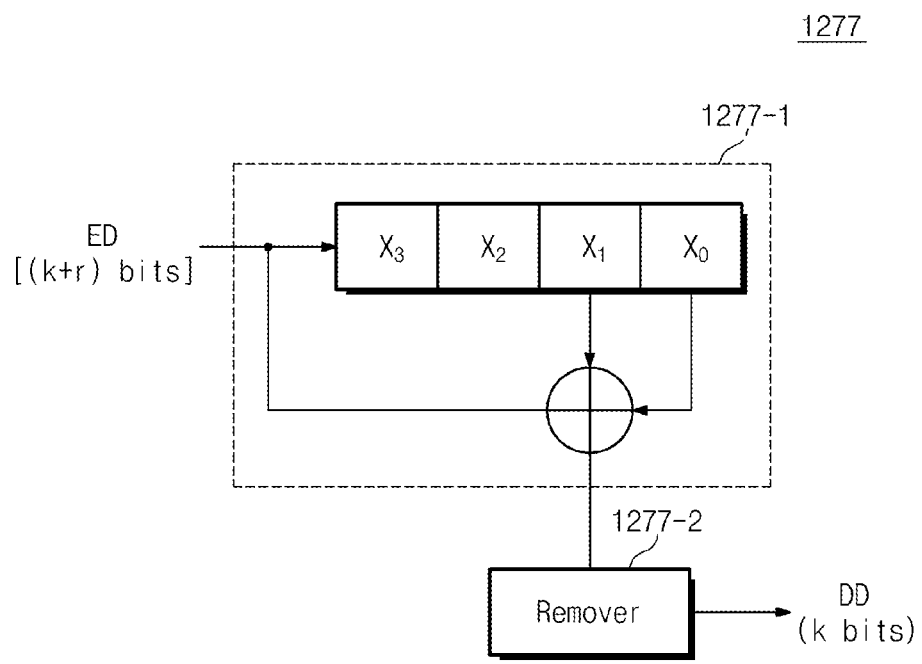
FIG. 7 is a diagram of a decoding unit in the guided scramble block of FIG. 4.

FIG. 7 shows an example of a decoding unit 1277 in guided scramble block 1270 shown in FIG. 4.

Referring to FIG. 7, guided scramble block 1270 comprises decoding unit 1277, which is configured to decode data ED encoded by an encoding unit. Encoded data ED is provided from nonvolatile memory device 1400, and it is formed of r-bit guide data and k-bit data. Decoding unit 1277 comprises a linear feedback shift register 1277-1 and a guide data remover 1277-2. Linear feedback shift register 1277-1 is configured to satisfy a polynomial such as $(X^4+X+1)$ as illustrated in FIG. 7. Guide data remover 1277-2 removes r-bit guide data from (k+r)-bit data decoded by linear feedback shift register 1277-1. Thus, guide data remover 1277-2 outputs k-bit data as original/decoded data DD.

Figure 8:
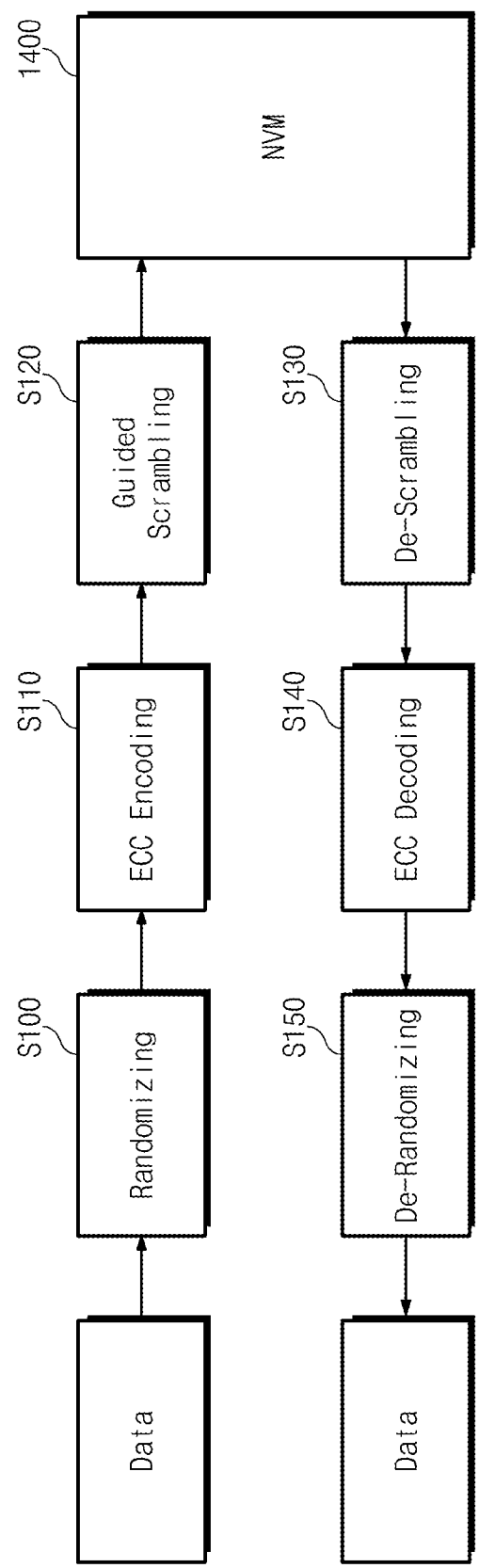
FIG. 8 is a data flow diagram illustrating a method of operating a memory system according to an embodiment of the inventive concept.

FIG. 8 is a data flow diagram illustrating a method of operating memory system 1000 of FIG. 2 according to an embodiment of the inventive concept. In the example of FIG. 8, data to be stored in nonvolatile memory device 1400 is stored in a buffer memory 1240 of memory controller 1200 according to an external request (or, an input of a write command).

Referring to FIG. 8, in operation S100, data to be stored in nonvolatile memory device 1400 is randomized by a randomizer 1260. In the randomized data, a ratio of a first bit number to a second bit number may be about 1:1. In other words, data states (i.e., erase and program states) may be generated uniformly. In operation S110, an ECC circuit 1260 generates parity data based on the randomized data. That is, ECC encoding may be performed. In operation S120, guided scrambling for the randomized data (or, randomized data and parity data) is performed by guided scramble block 1270. The guided scrambling is more fully described below.

K-bit data of the randomized data is provided to guided scramble block 1270. Adders 1272-1 to 1272-3 add guide data values r1 to r3 from register 1271 into input k-bit data, respectively. As set forth above, guide data values r1 to r3 typically have different values. Linear feedback shift registers 1273-1 to 1273-3 encode outputs (r1+k) to (k3+k) of adders 1272-1 to 1272-3. R-bit data and k-bit data are sequentially provided to each of linear feedback shift registers 1273-1 to 1273-3. Although the same k-bit data is provided to linear feedback shift registers 1273-1 to 1273-3, linear feedback shift registers 1273-1 to 1273-3 output different data values E(r1+k) to E(r3+k) because different r-bit guide data values are provided to linear feedback shift registers 1273-1 to 1273-3.

Outputs E(r1+k) to E(k3+k) of linear feedback shift registers 1273-1 to 1273-3 are provided to counters 1274-1 to 1274-3, respectively. A counter counts the number of first bits in input data. For example, counter 1274-1 may count the number of first bits (i.e., logical '1') in output E(r1+k) of linear feedback shift register 1273-1, counter 1274-2 may count the number of first bits (i.e., logical '1') in output E(r2+k) of linear feedback shift register 1273-2, and counter 1274-3 may count the number of first bits (i.e., logical '1') in output E(r3+k) of linear feedback shift register 1273-3. Comparison block 1275 selects the smallest count value among count values C1 to C3 from counters 1274-1 to 1274-3. Accordingly, the number of first bits in an output of a linear feedback shift register corresponding to the selected count value is smallest. Comparison block 1275 outputs selection signal SEL for selecting an output of a linear feedback shift register corresponding to the selected count value. Selector 1277 selects one of outputs E(r1+k) to E(k3+k) of linear feedback shift registers 1273-1 to 1273-3 in response to selection signal SEL. The selected output is sent to nonvolatile memory device 1400 as encoded data ED. The above-described guided scrambling may be repeated until write data is all received.

It is assumed that 2-bit data is stored in a memory cell via the above-described guided scrambling manner. Upon guided scrambling, a count value selected by comparison block 1275 is varied according to whether write data is LSB data or MSB data. For example, where write data is LSB data, comparison block 1275 may select a count value indicating that the number of second bits (e.g., logical '0' indicating programming of a memory cell) is smallest. As a reference for selecting a count value is changed, it is possible to reduce the number of memory cells each having uppermost program state P3. Thus, it is possible to reduce deterioration of a threshold voltage distribution of erased memory cells.

In certain other embodiments, a reference for selecting a count value may be fixed regardless of whether write data is LSB data or MSB data. For example, comparison block 1275 may select a count value indicating that the number of first bits (e.g., logical '1') is smallest. As the number of first bits is reduced, referring to FIG. 1, the number of memory cells each having uppermost program state P3 and the number of erased memory cells (or, memory cells each having an erase state E) may be reduced. This may mean that data states uniformly distributed via a randomizing operation of randomizer 1250 becomes irregular via the guided scrambling. Where the number of memory cells each having uppermost program state P3 is lowered, coupling between the memory cells having uppermost program state P3 and erased memory cells may be reduced. Thus, it is possible to reduce deterioration of a threshold voltage distribution of erased memory cells. Deterioration of a threshold voltage distribution of erased memory cells may be further bettered due to a decrease in the number of erased memory cells affected by memory cells each having uppermost program state P3.

As indicated by the foregoing, a reference for selecting a count value may be changed variously according to factors such as bit ordering and a cell-per-bit number. In addition, k-bit data may be stored in a main field of nonvolatile memory device 1400, and r-bit guide data may be stored in a spare field thereof. However, the inventive concept is not limited to these features. For example, k-bit data and r-bit guide data can be sequentially stored in the main field of nonvolatile memory device 1400. Collectively, operations S100, S110, and S120 form a method for generating program data to be stored in nonvolatile memory device 1400.

In response to a read request for data stored in nonvolatile memory device 1400, in operation S130, data read from nonvolatile memory device 1400 (i.e., data encoded via the guided scrambling) is decoded by guided scramble block 1270. Then, r-bit guide data added into k-bit data is removed. Decoding of guided scramble block 1270 is performed until all data (e.g., data having a size corresponding to an ECC unit) is output. In operation S140, ECC decoding is performed on the decoded data from guided scramble block 1270. After the ECC decoding, in operation S150, de-randomization is performed on error-corrected data (i.e., randomized data). The de-randomized data is temporarily stored in a buffer memory 1240. Thereafter, data stored in buffer memory 1240 (i.e., read-request data) is provided to an external device.

The following table shows probabilities of occurrence of data states according to a guided scramble unit and a guide bit number.

TABLE 1

| k-bit | r-bit | E | P1 | P2 | P3 |
|---|---|---|---|---|---|
| 64 | 4 | 23.69% | 37.77% | 23.66% | 14.88% |
| 128 | 4 | 24.33% | 33.76% | 24.32% | 17.60% |
| 256 | 4 | 24.69% | 31.01% | 24.70 | 19.60% |

Where data is randomized, the probability of occurrence of data states may be identical. That is, the probability of occurrence of each of data states E, P1, P2, and P3 may be 25%. However, if guided scrambling is applied to randomized data, as understood from table 1, the probability of occurrence of data states may become non-uniform. Further, the probability of occurrence of data states may be changed according to a guided scrambling unit, that is, a unit of data provided to a guided scramble block 1270. As a guided scramble unit increases, the probability of occurrence of the uppermost program state affecting an erase state may increase accordingly. On the other hand, as a guided scramble unit increases, the probability of occurrence of the uppermost program state affecting an erase state may decrease accordingly. Although the probability of occurrence of the uppermost program state affecting an erase state is varied according to the guided scramble unit, the probability of occurrence of the uppermost program state associated with data, to which the guided scrambling is applied, may become lower than that (25%) associated with randomized data. Thus, deterioration of a threshold voltage distribution of erased memory cells may be reduced by decreasing the number of memory cells each having uppermost program state P3 (or, making the chance of data states become irregular). The probability of occurrence of data states is variable according to a guide bit number and an order of a linear feedback shift register.

Figure 9:
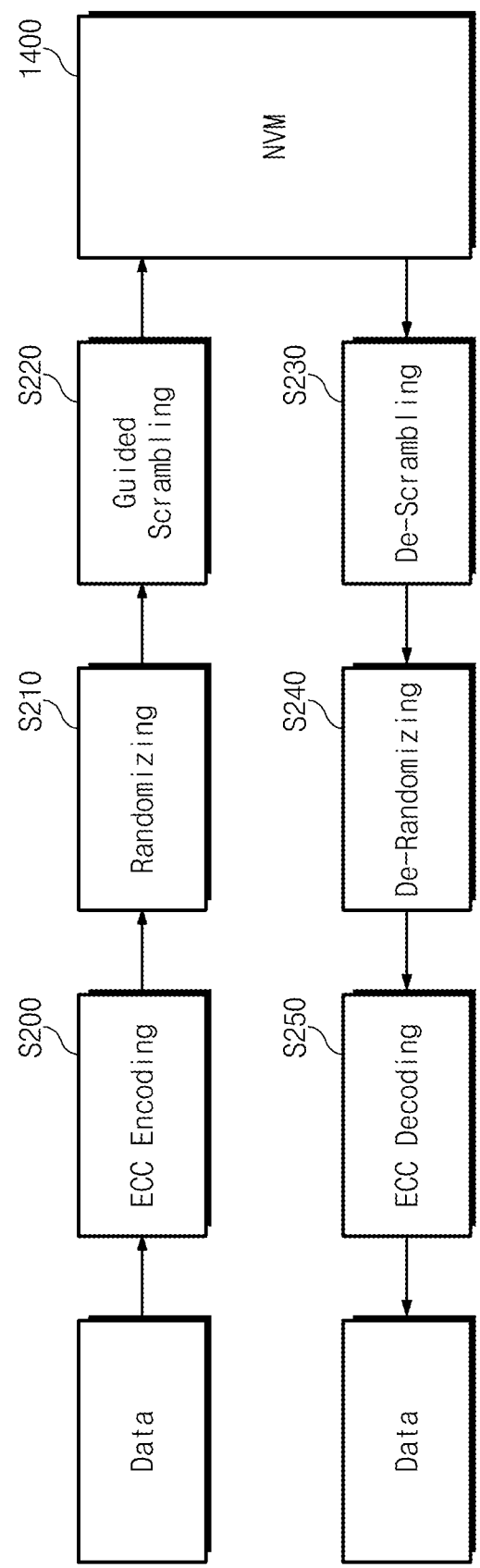
FIG. 9 is a data flow diagram illustrating a method of operating a memory system according to another embodiment of the inventive concept.

FIG. 9 is a data flow diagram illustrating a method of operating memory system 1000 according to another embodiment of the inventive concept. The method of FIG. 9 is similar to the method of FIG. 8, except that the order of operations is changed.

Referring to FIG. 9, the method comprises an ECC encoding operation S200, a randomizing operation S210, a guided scramble operation S220, a de-scrambling operation S230, a de-randomizing operation S240, and an ECC decoding operation S250. ECC encoding operation S200, randomizing operation S210, guided scramble operation S220, de-scrambling operation S230, de-randomizing operation S240, and ECC decoding operation S250 may correspond to ECC encoding operation S110, randomizing operation S100, guided scramble operation S120, de-scrambling operation S130, de-randomizing operation S150, and ECC decoding operation S140 described in FIG. 8, respectively. Operations S200 to S250 are performed substantially the same as corresponding operations of FIG. 8, and description thereof is thus omitted.

Figure 10:
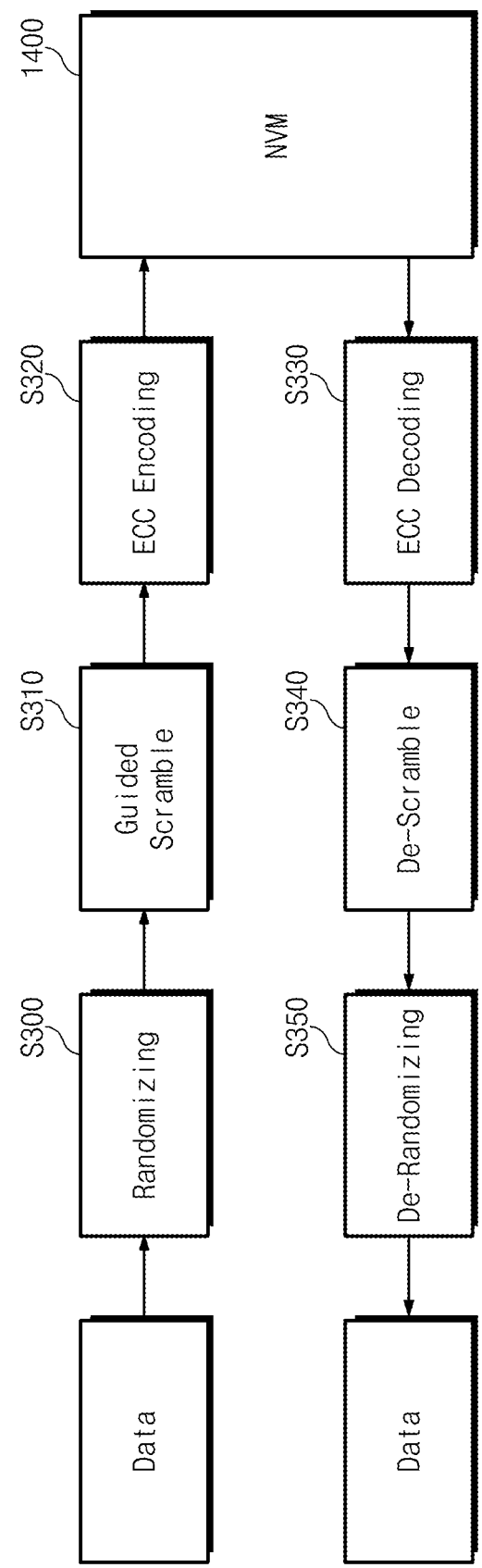
FIG. 10 is a data flow diagram illustrating a method of operating a memory system according to still another embodiment of the inventive concept.

FIG. 10 is a data flow diagram illustrating an operating method of a memory system according to still another embodiment of the inventive concept. The method of FIG. 10 is similar to the methods of FIGS. 8 and 9, except that the order of operations is changed.

Referring to FIG. 10, the method comprises a randomizing operation S300, a guided scramble operation S310, an ECC encoding operation S320, an ECC decoding operation S330, a de-scrambling operation S340, and a de-randomizing operation S350. Randomizing operation S300, guided scramble operation S310, ECC encoding operation S320, ECC decoding operation S330, de-scrambling operation S340, and de-randomizing operation S350 correspond to randomizing operation S100, guided scramble operation S120, ECC encoding operation S110, ECC decoding operation S140, de-scrambling operation S130, and de-randomizing operation S150 described in FIG. 8, respectively. Operations S300 to S350 are performed substantially the same as corresponding operations in FIG. 8, and description thereof is thus omitted.

Figure 11:
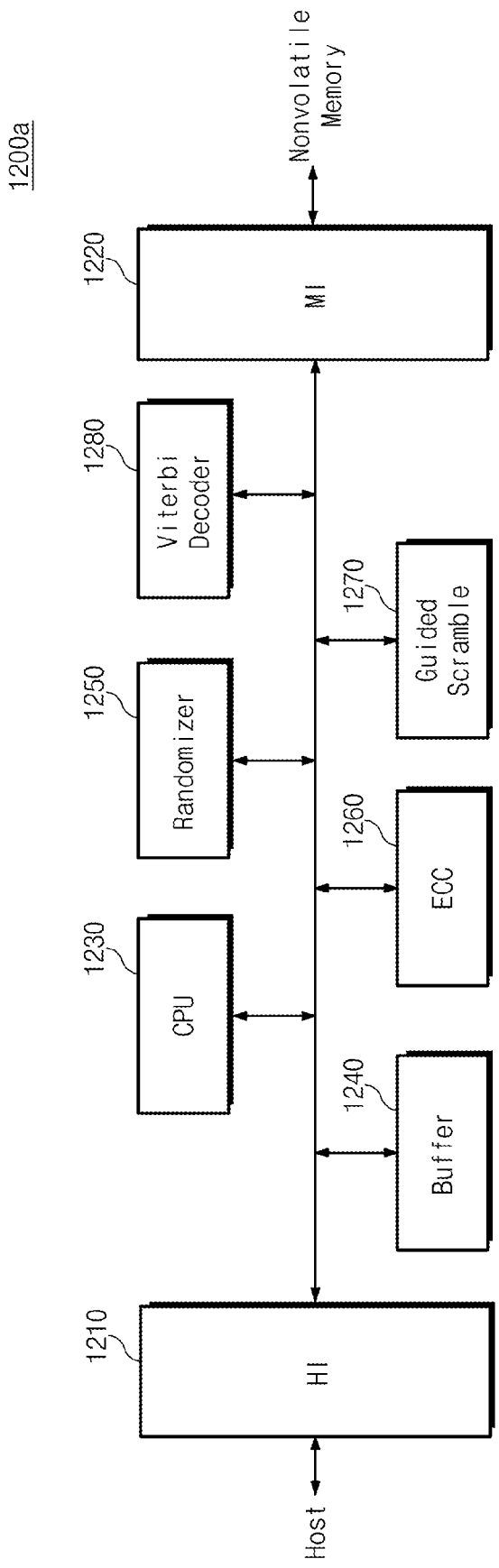
FIG. 11 is a block diagram of a memory controller according to another embodiment of the inventive concept.

FIG. 11 is a block diagram illustrating a memory controller according to another embodiment of the inventive concept. The memory controller of FIG. 11 is a variation of memory controller 1200 described with reference to FIG. 4.

Referring to FIG. 11, a memory controller 1200a comprises host interface 1210, memory interface 1220, CPU 1230, a buffer memory 1240, a randomizer 1250, an ECC circuit 1260, guided scramble block 1270, and a Viterbi decoder 1280. Elements 1210 to 1260 are substantially the same as corresponding elements illustrated in FIG. 4, and description thereof is thus omitted. Guided scramble block 1270 is configured the same as that illustrated in FIG. 5. That is, guided scramble block 1270 in FIG. 11 may perform an encoding operation associated with guided scrambling. A decoding operation associated with the guided scrambling is carried out via Viterbi decoder 1280. The decoding operation associated with the guided scrambling carried out via Viterbi decoder 1280 prevents error propagation that may occur where a decoding operation is performed by a decoding unit of guided scramble block 1270.

Figure 12:
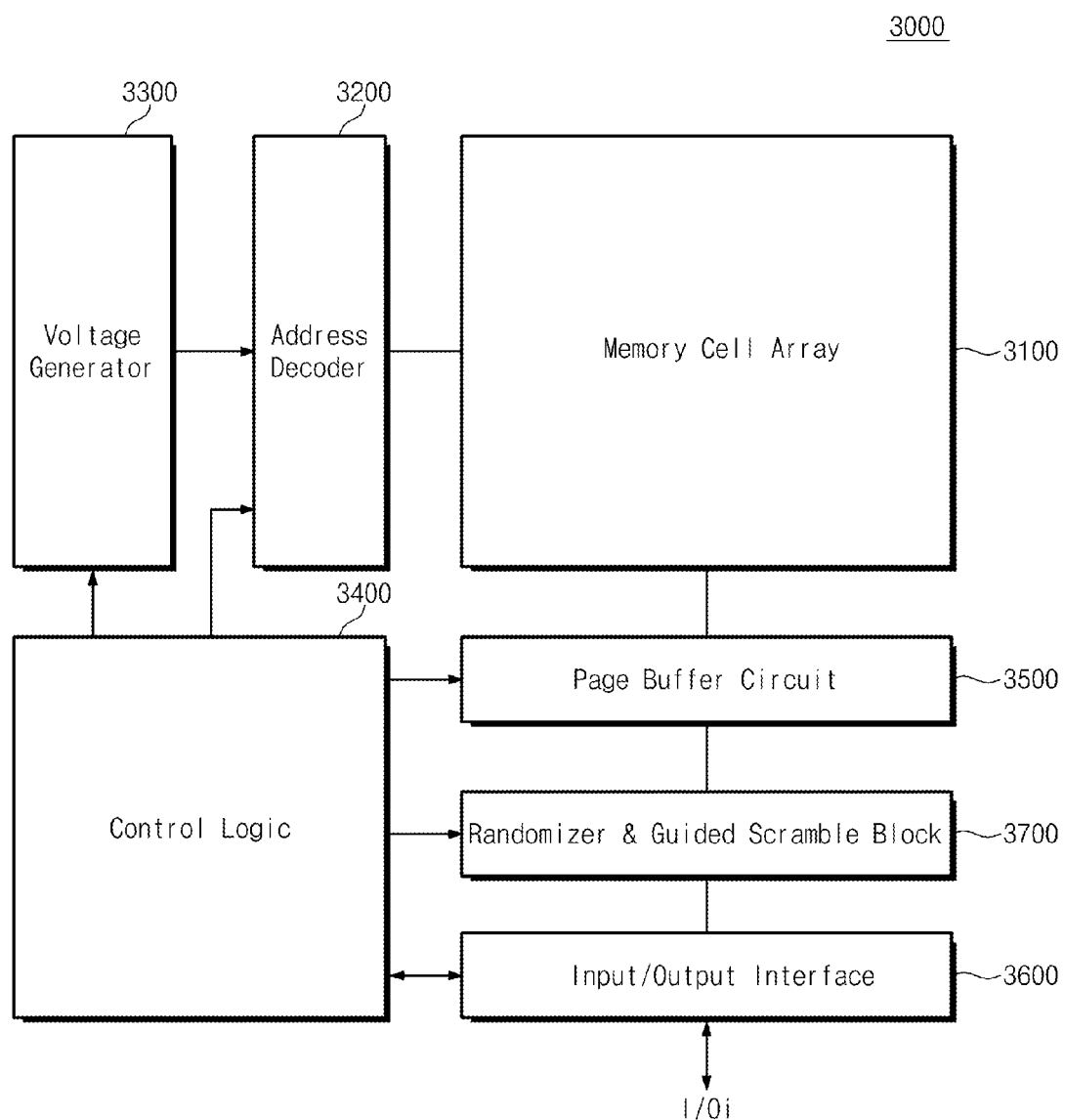
FIG. 12 is a block diagram of a nonvolatile memory device according to another embodiment of the inventive concept.

FIG. 12 is a block diagram illustrating a nonvolatile memory device according to another embodiment of the inventive concept.

Referring to FIG. 12, a nonvolatile memory device 300 comprises a memory cell array 3100, an address decoder 3200, a voltage generator 3300, control logic 3400, a page buffer circuit 3500, an input/output interface 3600, and a randomizer and guided scramble block 3700. The operation of certain features in FIG. 12 is similar to that of corresponding features in FIG. 3. Accordingly, additional description of these features may be omitted in order to avoid redundancy.

Randomizer and guided scramble block 3700 is formed of randomizer 1250 and guided scramble block 1270 described in relation to FIG. 4. Accordingly, randomization and guided scrambling may be performed within nonvolatile memory device 3000 in the same manner as described above. A memory controller for controlling nonvolatile memory device 3000 in FIG. 12 may not include a randomizer and a guided scramble block described in FIG. 4.

Figure 13:
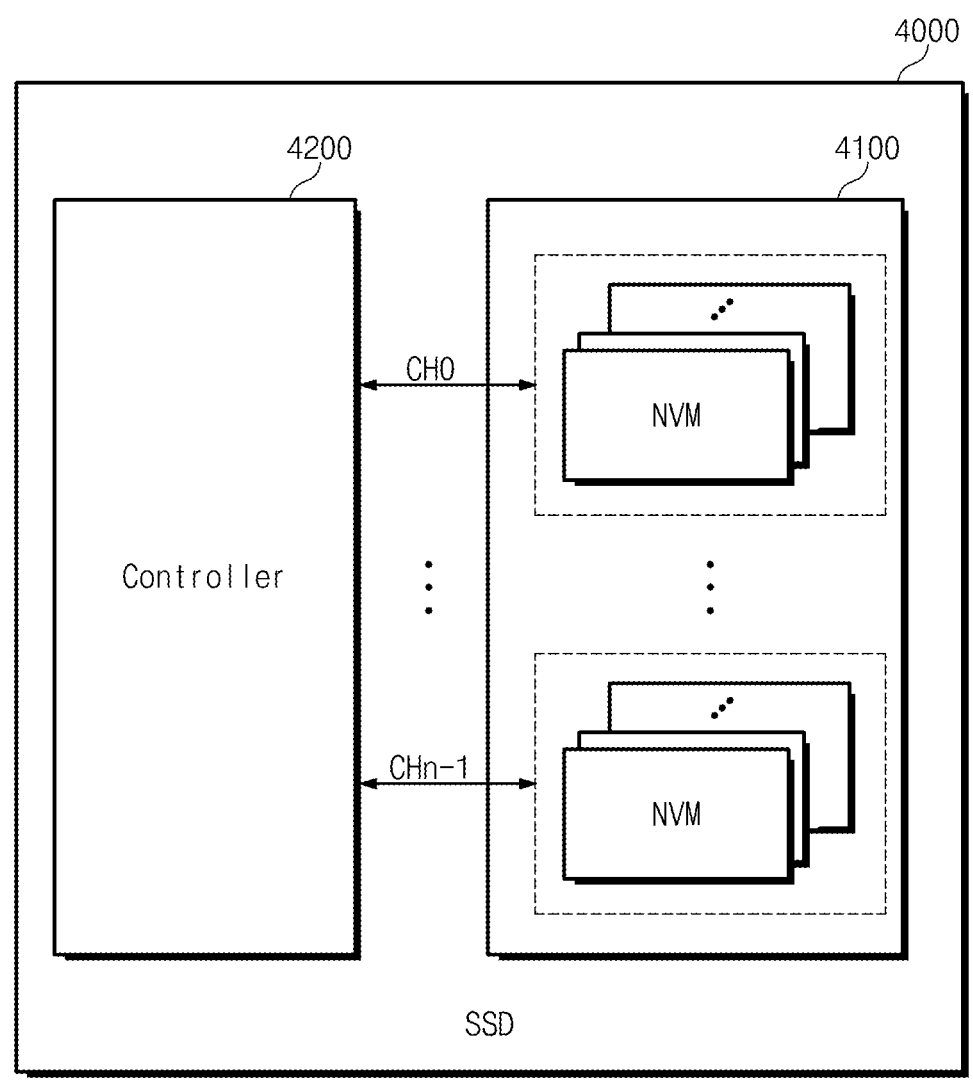
FIG. 13 is a block diagram of a solid state drive (SSD) according to an embodiment of the inventive concept.

FIG. 13 is a block diagram of an SSD according to an embodiment of the inventive concept.

Referring to FIG. 13, an SSD 4000 comprises a storage medium 4100 and a controller 4200. Storage medium 4100 is connected with controller 4200 via a plurality of channels CH0 to CHn−1 each connected in common to a plurality of nonvolatile memories NVM. Controller 4200 is configured substantially the same as controller 1200 or 1200a of FIG. 4 or 11. Accordingly, memory controller 4200 processes data to be stored in each nonvolatile memory device such that the probability of data states is decided to be non-uniform (or, the number of the uppermost program state affecting an erase state is reduced). Each nonvolatile memory device may be configured the same as illustrated in FIG. 3. Alternatively, each nonvolatile memory device may be configured the same as illustrated in FIG. 12. In this case, a randomizer and a guided scramble block in memory controller 4200 may be removed. Consequently, deterioration of a threshold voltage distribution of eased memory cells may be reduced by decreasing the number of memory cells each having the uppermost program state.

Figure 14:
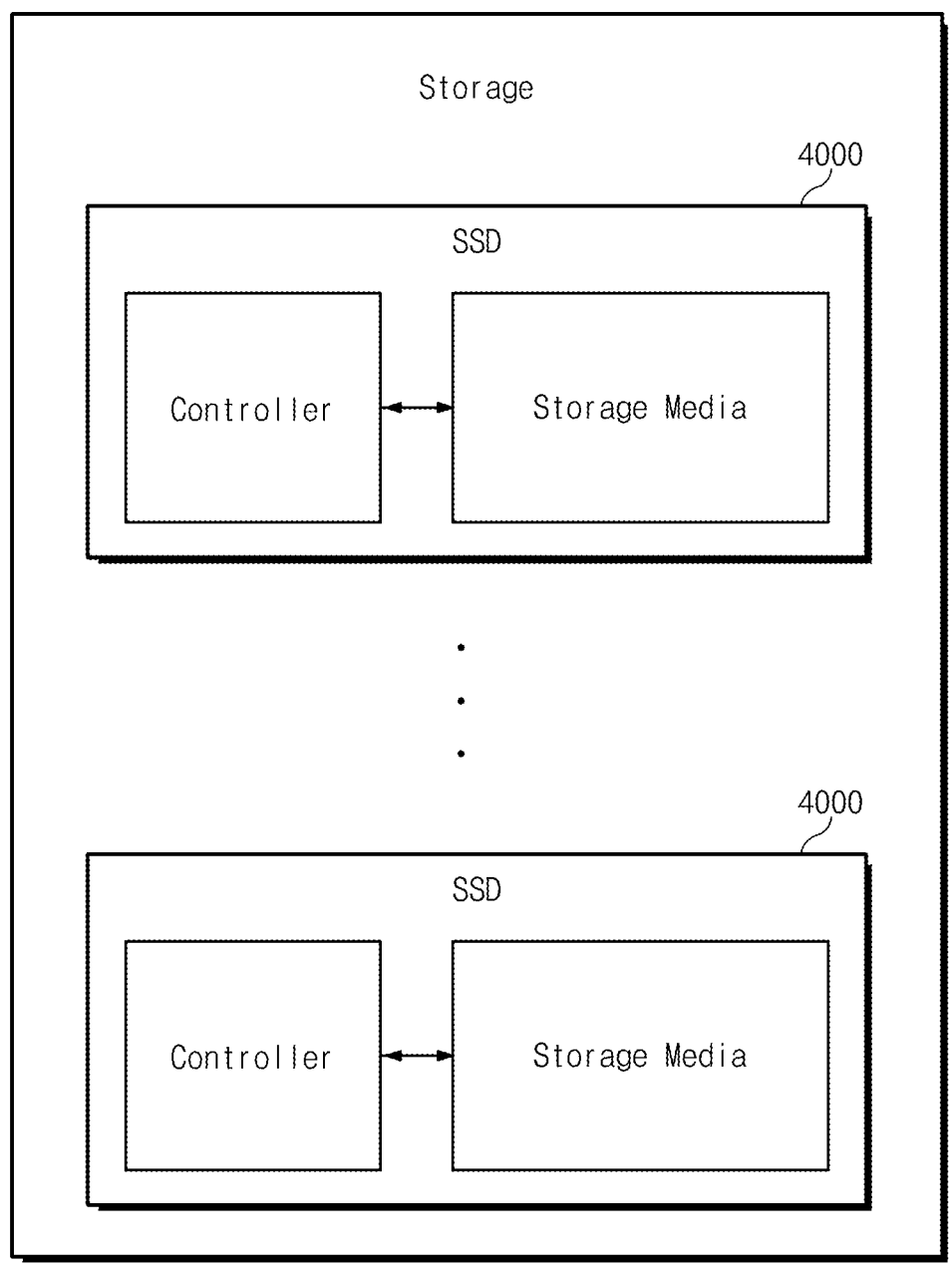
FIG. 14 is a block diagram of a storage apparatus incorporating the SSD of FIG. 13.
Figure 15:
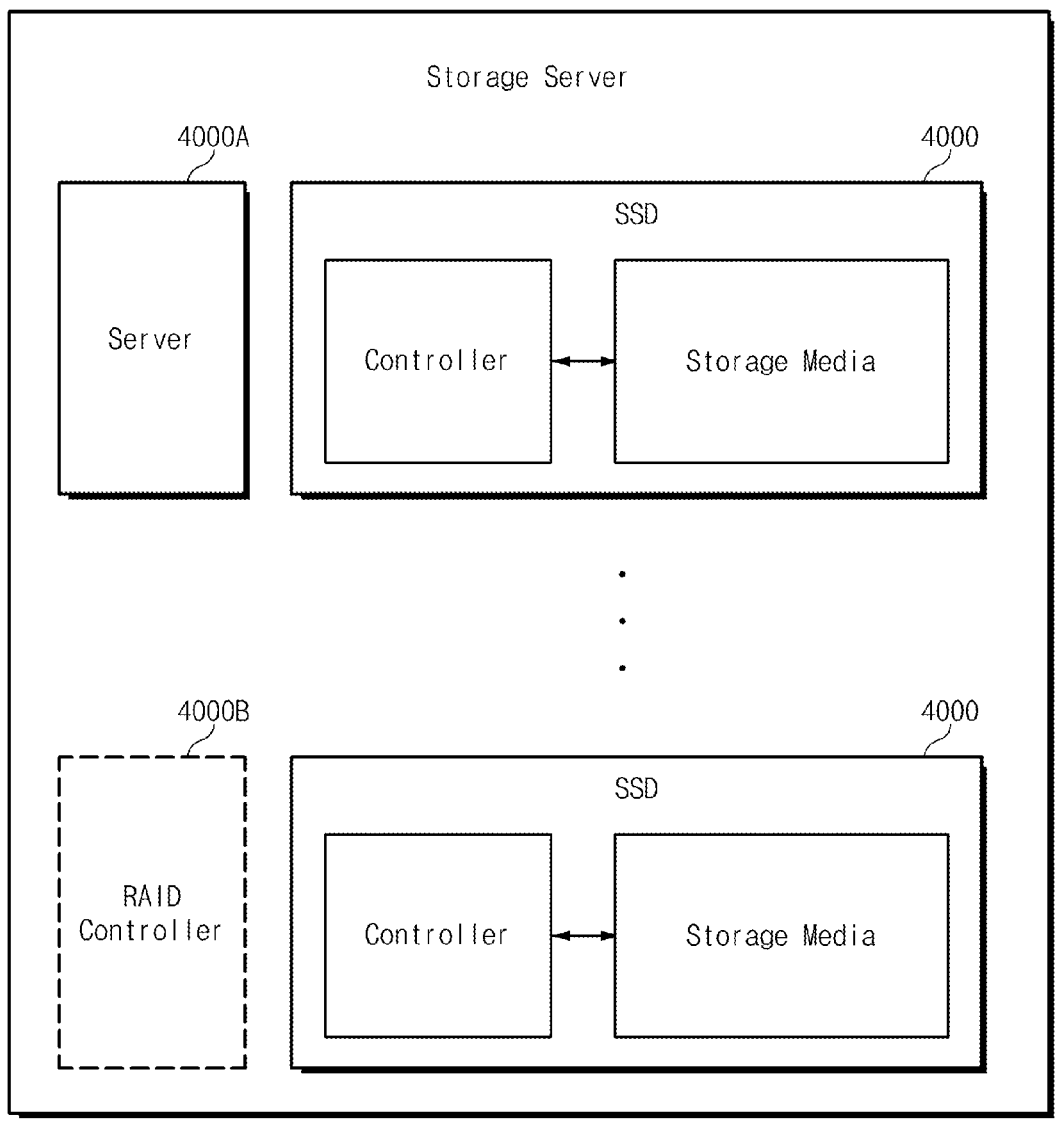
FIG. 15 is a block diagram of a storage server incorporating the SSD of FIG. 13.

FIG. 14 is a block diagram of a storage apparatus incorporating SSD 4000, and FIG. 15 is a block diagram of a storage server incorporating SSD 4000.

Referring to FIG. 14, the storage apparatus comprises a plurality of solid state drives 4000 configured the same as described in FIG. 13. Referring to FIG. 15, a storage server comprises a plurality of solid state drives 4000 configured the same as described in FIG. 13, and a server 4000A. Further, it is well comprehended that a well-known RAID controller 4000B is provided in the storage server.

Figure 16:
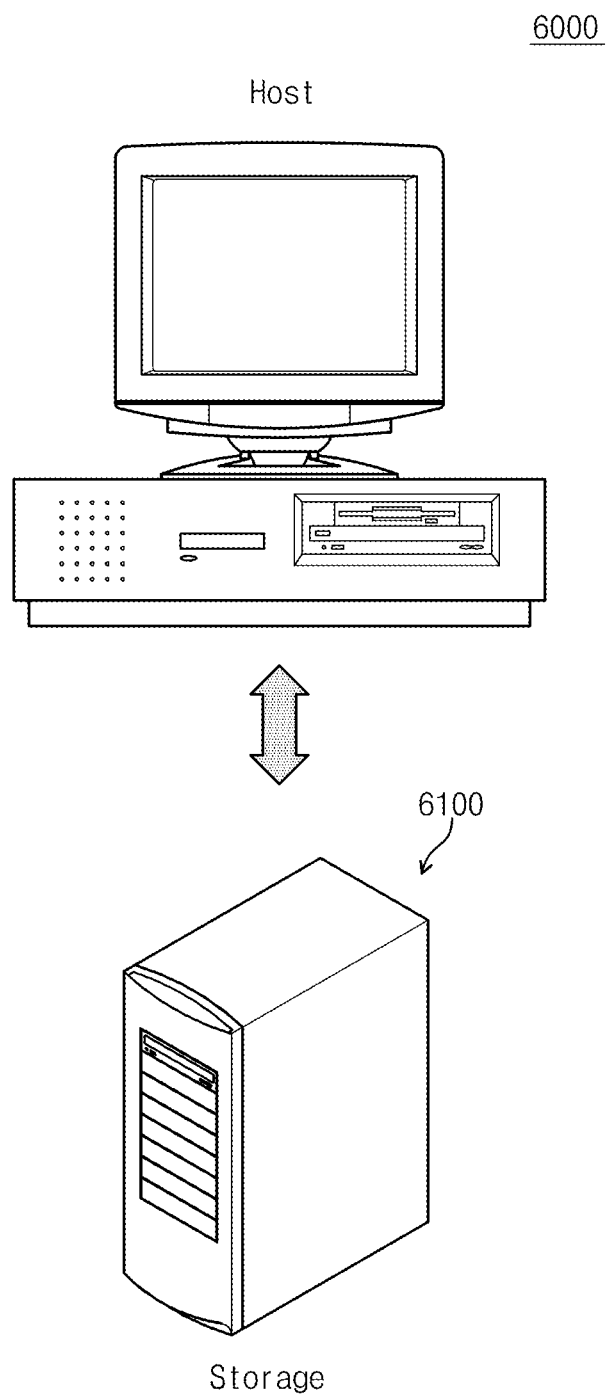
FIGS. 16 to 18 are diagrams of systems that may incorporate a data storage device according to certain embodiments of the inventive concept.
Figure 17:
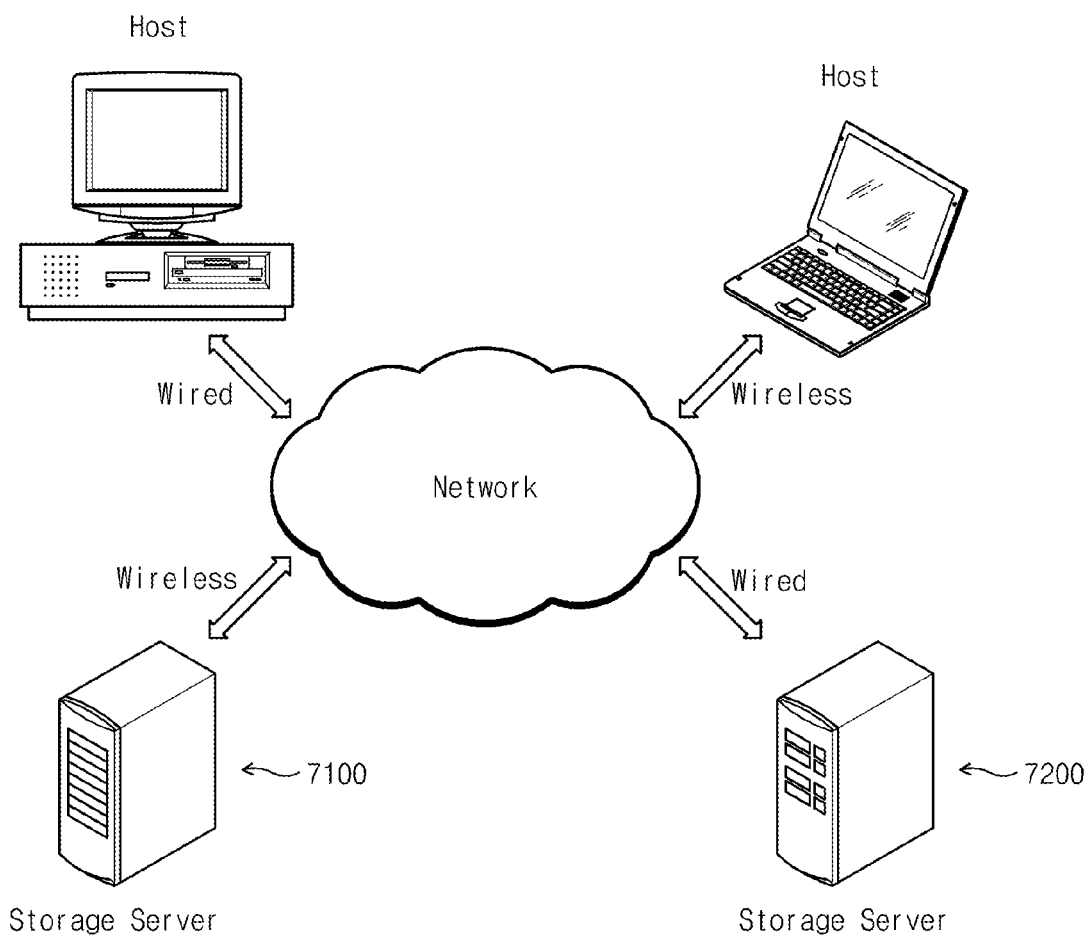
Figure 18:
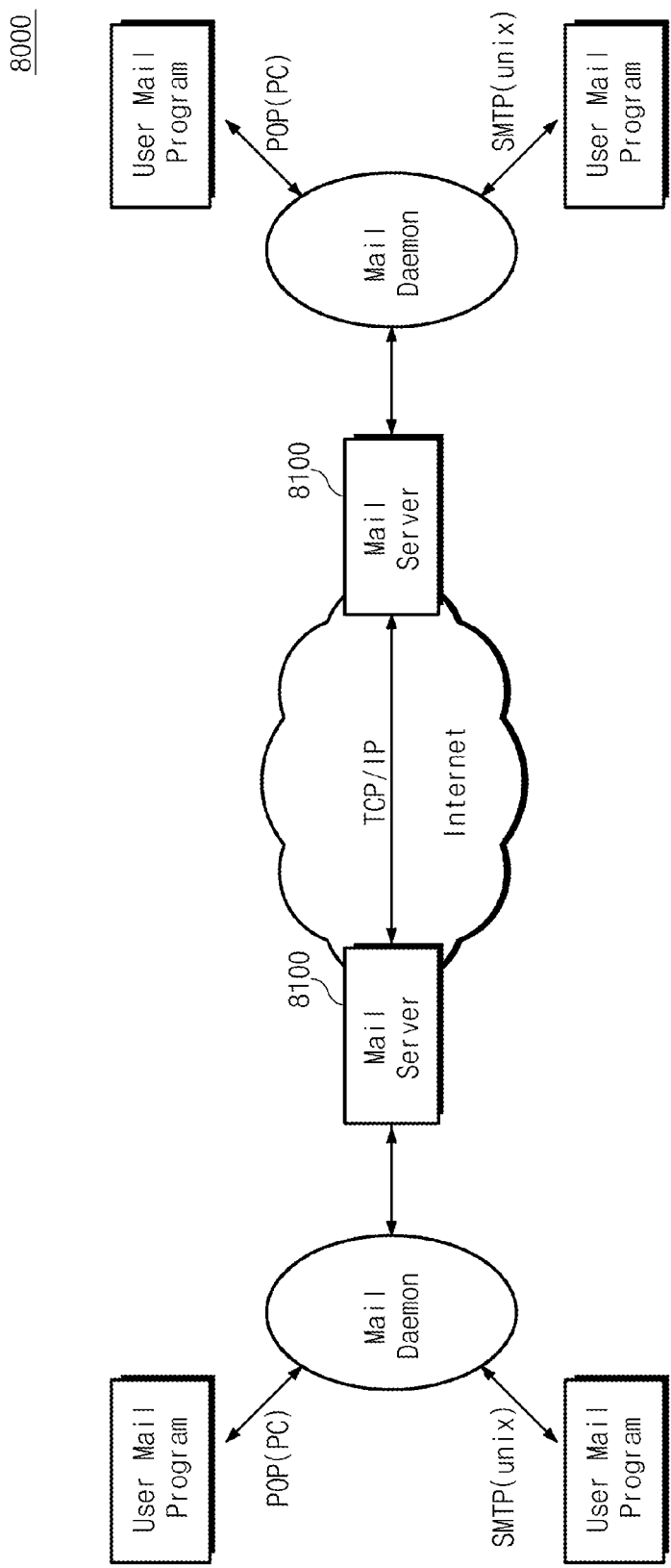

FIGS. 16 to 18 are diagrams of systems that may incorporate a data storage device according to certain embodiments of the inventive concept.

Referring to FIG. 16, a system 6000 comprises a storage device 6100 incorporating an SSD or other data storage device according to an embodiment of the inventive concept. Storage 6100 communicates with a host in a wired and/or wireless manner. Referring to FIG. 17, a system 7000 comprises storage servers 7100 and 7200 incorporating SSDs or other data storage devices according to embodiments of the inventive concept. Storage servers 7100 and 7200 communicate with a host in a wired and/or wireless manner. Referring to FIG. 18, a system 8000 comprises a mail server 8100 incorporating an SSD or other data storage device according to an embodiment of the inventive concept.

Figure 19:
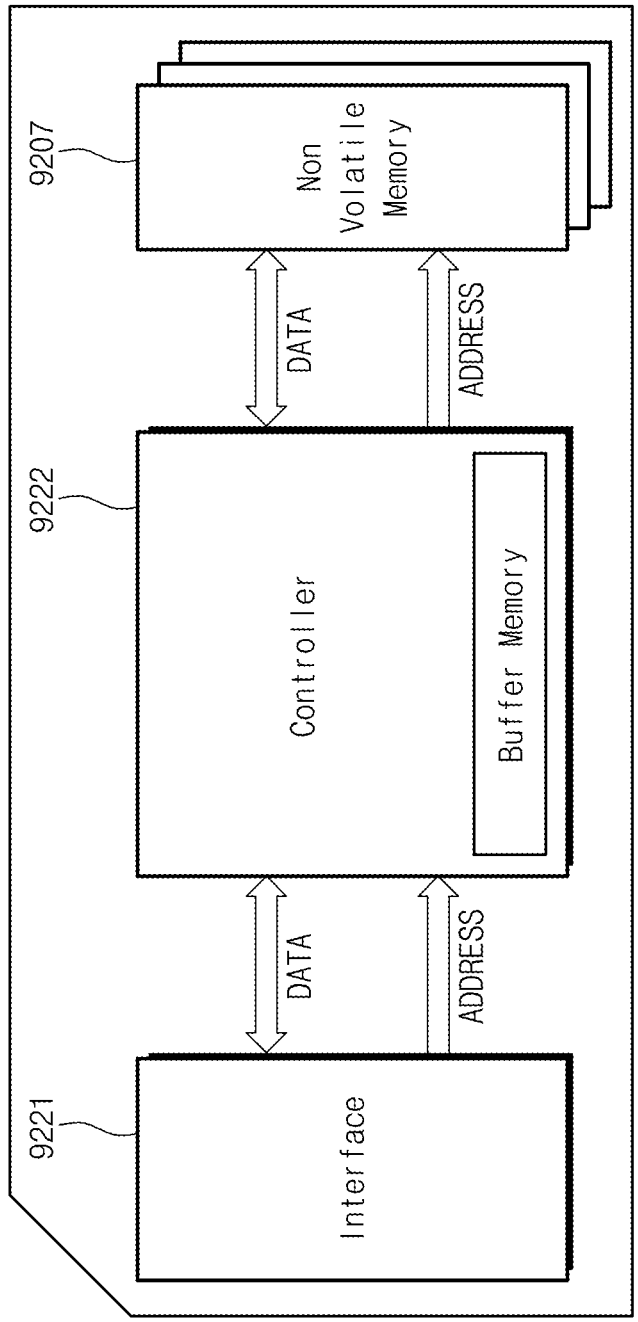
FIG. 19 is a block diagram of a memory card according to an embodiment of the inventive concept.

FIG. 19 is a block diagram illustrating a memory card according to an embodiment of the inventive concept. The memory card may be, for example, an MMC card, an SD card, a multiuse card, a micro-SD card, a memory stick, a compact SD card, an ID card, a PCMCIA card, an SSD card, a chip-card, a smartcard, an USB card, or the like.

Referring to FIG. 19, the memory card comprises an interface circuit 9221 for interfacing with an external device, a controller 9222 comprising a buffer memory and controlling an operation of the memory card, and at least one nonvolatile memory device 9207. Controller 9222 may be a processor which is configured to control write and read operations of the non-volatile memory device 9207. In particular, controller 9222 may be coupled with the non-volatile memory device 9207 and interface circuit 2221 via a data bus and an address bus. Controller 9222 may be configured the same as illustrated in FIG. 4 or 11. That is, controller 9222 may process data to be stored in each nonvolatile memory device such that the probability of data states is decided to be non-uniform (or, the number of the uppermost program state affecting an erase state is reduced). Each nonvolatile memory device may be configured the same as illustrated in FIG. 3. Alternatively, each nonvolatile memory device may be configured the same as illustrated in FIG. 12. In this case, a randomizer and a guided scramble block in controller 9222 may be removed. Consequently, deterioration of a threshold voltage distribution of eased memory cells may be reduced by decreasing the number of memory cells each having the uppermost program state.

Figure 20:
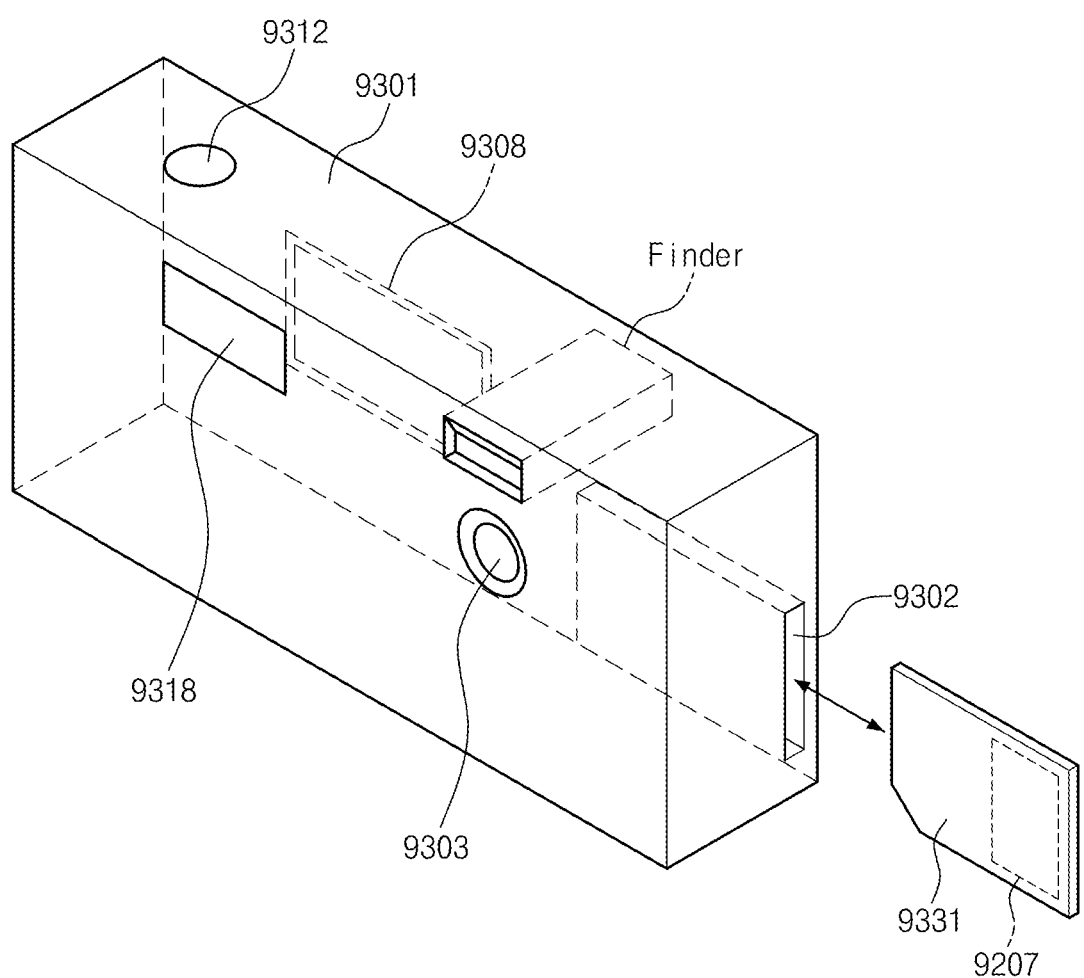
FIG. 20 is a block diagram of a digital still camera according to an embodiment of the inventive concept.

FIG. 20 is a block diagram illustrating a digital still camera according to an embodiment of the inventive concept.

Referring to FIG. 20, the digital still camera comprises a body 9301, a slot 9302, a lens 9303, a display circuit 9308, a shutter button 9312, and a strobe 9318. A memory card 9331 is inserted in slot 9308 and comprises a memory controller and a nonvolatile memory device according to an embodiment of the inventive concept. For example, the memory controller may be configured the same as illustrated in FIG. 4 or 11. The memory controller processes data to be stored in the nonvolatile memory device such that the probability of data states is decided to be non-uniform (or, the number of the uppermost program state affecting an erase state is reduced). The nonvolatile memory device may be configured the same as illustrated in FIG. 3. Alternatively, the nonvolatile memory device may be configured the same as illustrated in FIG. 12. In this case, a randomizer and a guided scramble block in controller 9222 may be removed. Consequently, deterioration of a threshold voltage distribution of eased memory cells may be reduced by decreasing the number of memory cells each having the uppermost program state.

Where memory card 9331 has a contact type, an electric circuit on a circuit board is electrically contacted with memory card 9331 when it is inserted in slot 9308. Where memory card 9331 has a non-contact type, an electric circuit on a circuit board communicates with memory card 9331 in a radio-frequency manner.

Figure 21:
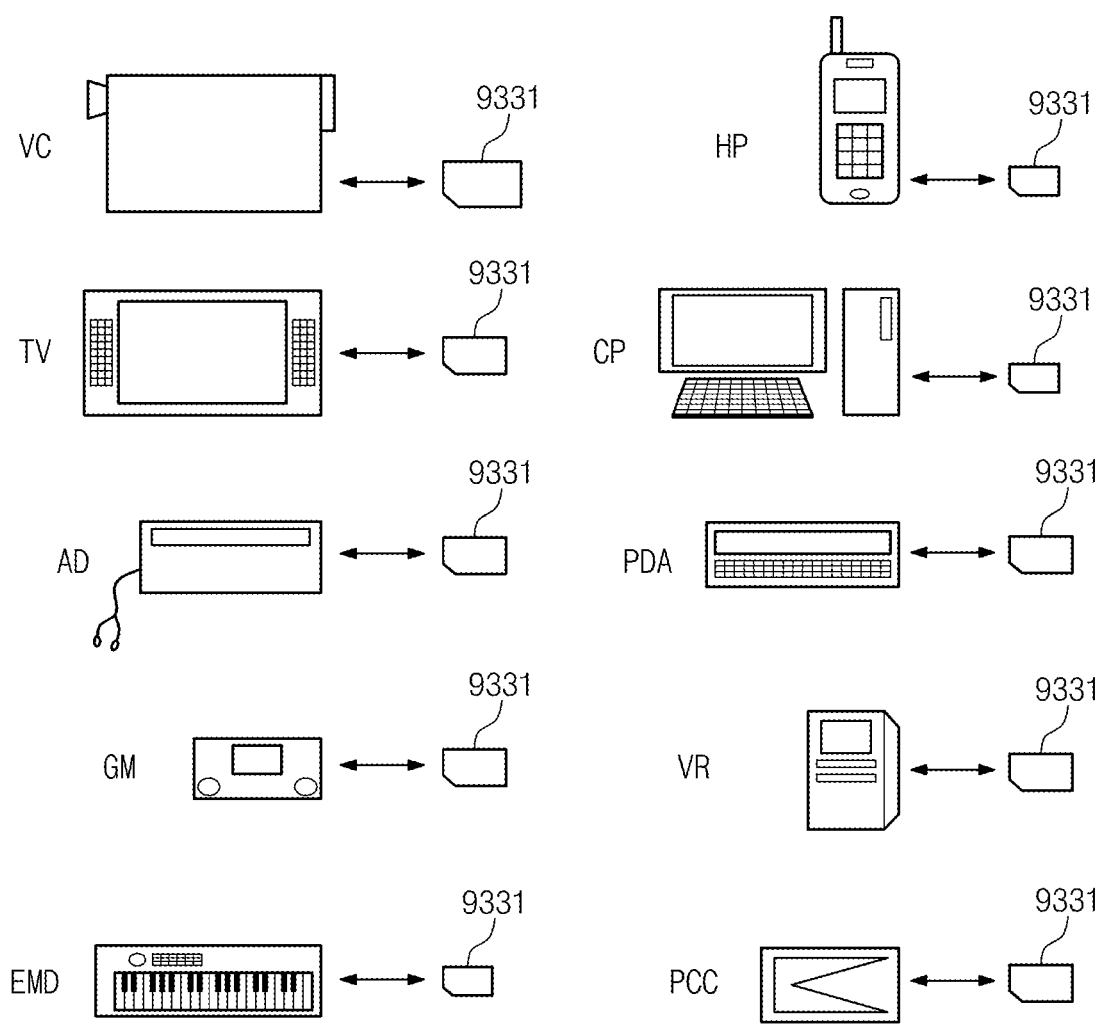
FIG. 21 is a diagram illustrating various systems configured to use a memory card such as that illustrated in FIG. 20.

FIG. 21 is a diagram illustrating various systems configured to use a memory card such as that illustrated in FIG. 20.

Referring to FIG. 21, memory card 9331 may be incorporated in a video camera VC, a television TV, an audio device AD, a game machine GM, an electronic music device EMD, a cellular phone HP, a computer CP, a Personal Digital Assistant PDA, a voice recorder VR, or a PC card PCC, for example.

Figure 22:
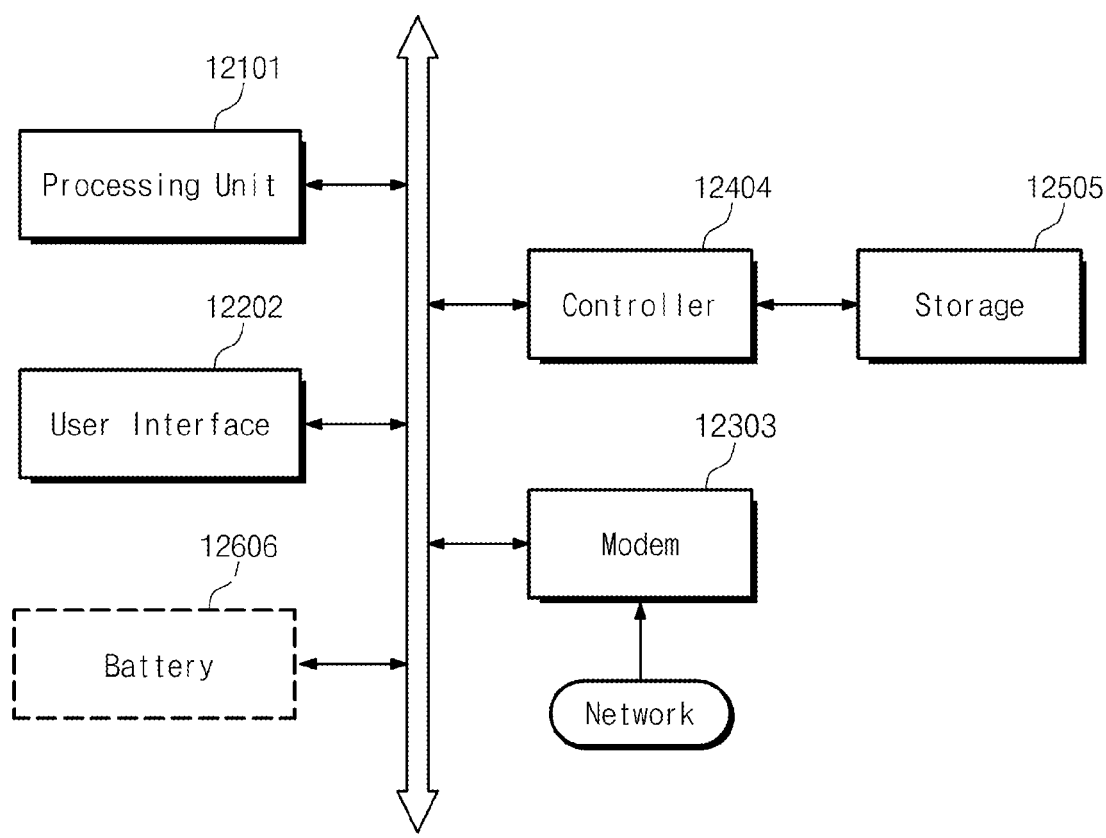
FIG. 22 is a block diagram of a computing system according to an embodiment of the inventive concept.

FIG. 22 is a block diagram of a computing system according to an embodiment of the inventive concept.

Referring to FIG. 22, the computing system comprises a processing unit 12101, a user interface 12202, a modem 12303 such as a baseband chipset, a memory controller 12404, and a nonvolatile memory device 12505 as a storage medium. Memory controller 12404 may be configured substantially the same as controller 1200 or 1200a of FIG. 4 or 11. Accordingly, memory controller 12404 may process data to be stored in nonvolatile memory device 12505 such that the probability of data states is decided to be non-uniform (or, the number of the uppermost program state affecting an erase state is reduced).

Nonvolatile memory device 12505 is configured substantially the same as nonvolatile memory device 1400 of FIG. 3. Alternatively, nonvolatile memory device 12505 may be configured the same as nonvolatile memory device 3000 of FIG. 12. In this case, a randomizer and a guided scramble block in memory controller 12404 may be removed. Consequently, deterioration of a threshold voltage distribution of eased memory cells may be reduced by decreasing the number of memory cells each having the uppermost program state. N-bit data (N being 1 or more integer) processed/to be processed by processing unit 12101 may be stored in nonvolatile memory device 12505 through memory controller 12404. Where the computing system is a mobile device, a battery 12606 may be further in the computing system to supply an operating voltage thereto. Although not illustrated in FIG. 22, the computing system may further comprise an application chipset, a camera image processor (CIS), a mobile DRAM, and the like.

In certain embodiments of the inventive concept, memory cells may be formed of variable resistance memory cells. Examples of variable resistance memory cells and memory devices incorporating the same are disclosed in U.S. Pat. No. 7,529,124, the subject matter of which is incorporated by reference herein. In certain alternative embodiments, memory cells are formed of one of various cell structures having a charge storage layer. Cell structures having a charge storage layer include a charge trap flash structure using a charge trap layer, a stack flash structure in which arrays are stacked in a multiple layer, a source-drain free flash structure, a pin-type flash structure, etc. Examples of memory devices having a charge trap flash structure as a charge storage layer are disclosed in U.S. Pat. No. 6,858,906 and U.S. Publication Nos. 2004/0169238 and 2006/0180851, the subject matter of which is hereby incorporated by reference. A source-drain free flash structure is KR Patent No. 673020, the subject matter of which is hereby incorporated by reference.

A nonvolatile memory device and/or a memory controller according to certain embodiments of the inventive concept may be packaged using various types of packages or package configurations. Examples of such packages or package configurations include Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method generating program data to be stored in a nonvolatile memory device, comprising:
   randomizing the program data;
   adding different guide data to different copies of the randomized program data to produce multiple units of modified data each having more bits than the program data;
   determining a number of bits in each of the units of modified data having a first data state; and
   based on the determined numbers, selecting one of the units of modified data as guided scramble data to be stored in the nonvolatile memory device,
   wherein the selected unit has a highest or lowest number of bits with the first data state among the units of modified data, and
   wherein the first data state is a state of least significant bit (LSB) data or most significant bit (MSB) data of an uppermost program state or an erase state of multi-bit data and the nonvolatile memory device is a multi-level-cell memory device.

2. The method of claim 1, wherein the first data state is logical "0", the selected one of the units has a lowest number of bits with the first data state, and the first data state corresponds to LSB data of the uppermost program state, where the at least one data state comprises an uppermost program state is logical "01".

3. The method of claim 1, further comprising ECC encoding the randomized program data before adding the guide data.

4. The method of claim 1, further comprising performing ECC encoding on the program data before the randomizing.

5. The method of claim 1, further comprising ECC encoding the modified data after it is processed.

6. The method of claim 1, further comprising:
   reading data from the nonvolatile memory device; and
   decoding the read data using a Viterbi decoder.

7. A memory controller configured to control a nonvolatile memory device, comprising:
   a randomizer configured to randomize program data to be stored in the nonvolatile memory device; and
   a guided scramble block configured to add different guide data to multiple copies of the randomized program data to produce different units of modified data each having more bits than the randomized program data, to determine a number of bits in each of the units of modified data having a first data state, and to, select one of the units of modified data as guided scramble data to be stored in the nonvolatile memory device based on the determined numbers, wherein the selected unit has a highest or lowest number of bits with the first data state among the units of modified data, and wherein the first data state is a state of least significant bit (LSB) data or most significant bit (MSB) data of an uppermost program state or an erase state of multi-bit data and the nonvolatile memory device is a multi-level-cell memory device.

8. The memory controller of claim 7, wherein the guided scramble block comprises:
   an adder block configured to add the guide data to the randomized program data;
   a linear feedback shift register configured to generate encoded data values from the modified data;
   a count block configured to count a number of logical '1' bits in each of the encoded data values;
   a comparison block configured to select a count value corresponding to a minimum value of count values corresponding to the encoded data values and to generate a selection signal indicating a count value corresponding to the minimum value; and
   a selector configured to output an encoded data value corresponding to the selected count value as the guided scramble data in response to the selection signal.

9. The memory controller of claim 8, wherein the guided scramble block further comprises:
   a linear feedback shift register configured to decode data read out from the nonvolatile memory device; and a guide data remover configured to remove the added guide data from an output of the linear feedback shift register.

10. The memory controller of claim 8, further comprising:
a Viterbi decoder configured to decode data read out from the nonvolatile memory device.

11. The memory controller of claim 7, further comprising:
an ECC circuit configured to perform ECC encoding on the randomized program data or ECC decoding on output data of the guided scramble block.

12. A memory system comprising:
a controller configured to randomize program data, add different guide data to different copies of the randomized program data to produce multiple units of modified data each having more bits than the randomized program data, determine a number of bits in each of the units of modified data having a first data state, selecting one of the units of modified data as guided scramble data to be stored in the nonvolatile memory device based on the determined numbers, wherein the first data state is a state of least significant bit (LSB) data or most significant bit (MSB) data of an uppermost program state or an erase state of multi-bit data; and
a nonvolatile memory device configured to store the guided scramble data, wherein the nonvolatile memory device is a multi-level-cell flash memory device.

13. The memory system of claim 12, wherein the first data state comprises an uppermost program state.

* * * * *